US012191252B2

(12) United States Patent
Tuncer

(10) Patent No.: US 12,191,252 B2
(45) Date of Patent: Jan. 7, 2025

(54) SEMICONDUCTOR FUSE WITH MULTI-BOND WIRE

(71) Applicant: Texas Instruments Incorporated, Dallas, TX (US)

(72) Inventor: Enis Tuncer, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 192 days.

(21) Appl. No.: 17/546,383

(22) Filed: Dec. 9, 2021

(65) Prior Publication Data

US 2023/0187348 A1 Jun. 15, 2023

(51) Int. Cl.
*H01L 23/525* (2006.01)
*H01L 21/56* (2006.01)
*H01L 23/00* (2006.01)
*H01L 23/31* (2006.01)

(52) U.S. Cl.
CPC .......... *H01L 23/5256* (2013.01); *H01L 21/56* (2013.01); *H01L 23/3107* (2013.01); *H01L 24/43* (2013.01); *H01L 24/48* (2013.01); *H01L 24/49* (2013.01); *H01L 2224/4321* (2013.01); *H01L 2224/48175* (2013.01); *H01L 2224/49421* (2013.01); *H01L 2224/49427* (2013.01)

(58) Field of Classification Search
CPC . H01L 23/5256; H01L 23/3107; H01L 24/43; H01L 24/48; H01L 24/49; H01L 21/56
See application file for complete search history.

(56) References Cited

U.S. PATENT DOCUMENTS

| 7,808,075 B1* | 10/2010 | Cheng ................. H01L 25/0657 257/528 |
| 10,770,378 B1* | 9/2020 | Tuncer .............. H01L 23/49503 |
| 2003/0153122 A1* | 8/2003 | Brooks ................... H01L 24/06 257/784 |
| 2004/0145042 A1* | 7/2004 | Morita ................ H01L 25/0657 257/E23.079 |
| 2007/0215993 A1* | 9/2007 | Chen ....................... H01L 24/85 257/E23.125 |

OTHER PUBLICATIONS

J. Ted DiBene II Ph.D., "Power on Silicon with on-die Magnetics: The start of a Revolution in Power Delivery and Power Management for SoC's and High Performance Applications", Intel Corporation, For PowerSoC Oct. 13, 2010 Cork, Ireland.

* cited by examiner

*Primary Examiner* — Marc Anthony Armand
(74) *Attorney, Agent, or Firm* — Ronald O. Neerings; Frank D. Cimino

(57) ABSTRACT

An electronic device has a fuse circuit including a semiconductor die and first and second bond wires, the semiconductor die having a bond pad and a fuse, the fuse having first and second portions, the bond pad coupled to the first portion of the fuse, and the second portion of the fuse coupled to a protected circuit, the first bond wire having a first end coupled to the bond pad and a second end coupled to a conductive terminal, and the second bond wire having a first end coupled to the second end of the first bond wire and a second end coupled to the conductive terminal.

21 Claims, 22 Drawing Sheets

SEMICONDUCTOR FUSE WITH MULTI-BOND WIRE

BACKGROUND

Packaged electronic devices, such as in isolation devices can include integrated fuse circuitry, with a fuse formed in a semiconductor die. A bond pad is connected to a portion of the fuse, and a bond wire connects the bond pad to a lead of the packaged device. However, the bond wire connection to the bond pad can fail before the fuse blows, leading to uncontrolled and undesired failure during large current and voltage transients in isolation devices with an integrated fuse. Increasing the bond wire diameter can increase the current carrying capability, but this approach requires increasing the bond pad size.

SUMMARY

In one aspect, an electronic device includes a package structure, a conductive terminal, a semiconductor die, and first and second bond wires. The conductive terminal extends outside the package structure. The semiconductor die has a bond pad and a fuse, where the bond pad is coupled to a portion of the fuse. The first bond wire is enclosed by the package structure and has first and second ends. The first end of the first bond wire is coupled to the bond pad, and the second end of the first bond wire is coupled to the conductive terminal. The second bond wire is enclosed by the package structure and has first and second ends. The first end of the second bond wire is coupled to the first end of the first bond wire, and the second end of the second bond wire is coupled to the conductive terminal.

In another aspect, a fuse circuit includes a semiconductor die having a bond pad and a fuse with first and second portions. The bond pad is coupled to the first portion of the fuse, and the second portion of the fuse is coupled to a protected circuit. A first bond wire has a first end coupled to the bond pad, and a second end coupled to a conductive terminal. A second bond wire has a first end coupled to the first end of the first bond wire, and the second end of the second bond wire is coupled to the conductive terminal.

In a further aspect, a method for fabricating an electronic device includes attaching a semiconductor die to a die attach pad and performing a wire bonding process. The wire bonding process includes coupling a first end of a first bond wire to the bond pad, coupling a second end of the first bond wire to a conductive terminal, coupling a first end of a second bond wire to the first end of the first bond wire, and coupling a second end of the second bond wire to the conductive terminal. The method further includes performing a molding process that encloses the semiconductor die, the first and second bond wires, and a portion of the conductive terminal in a package structure.

DETAILED DESCRIPTION

Figure 1:
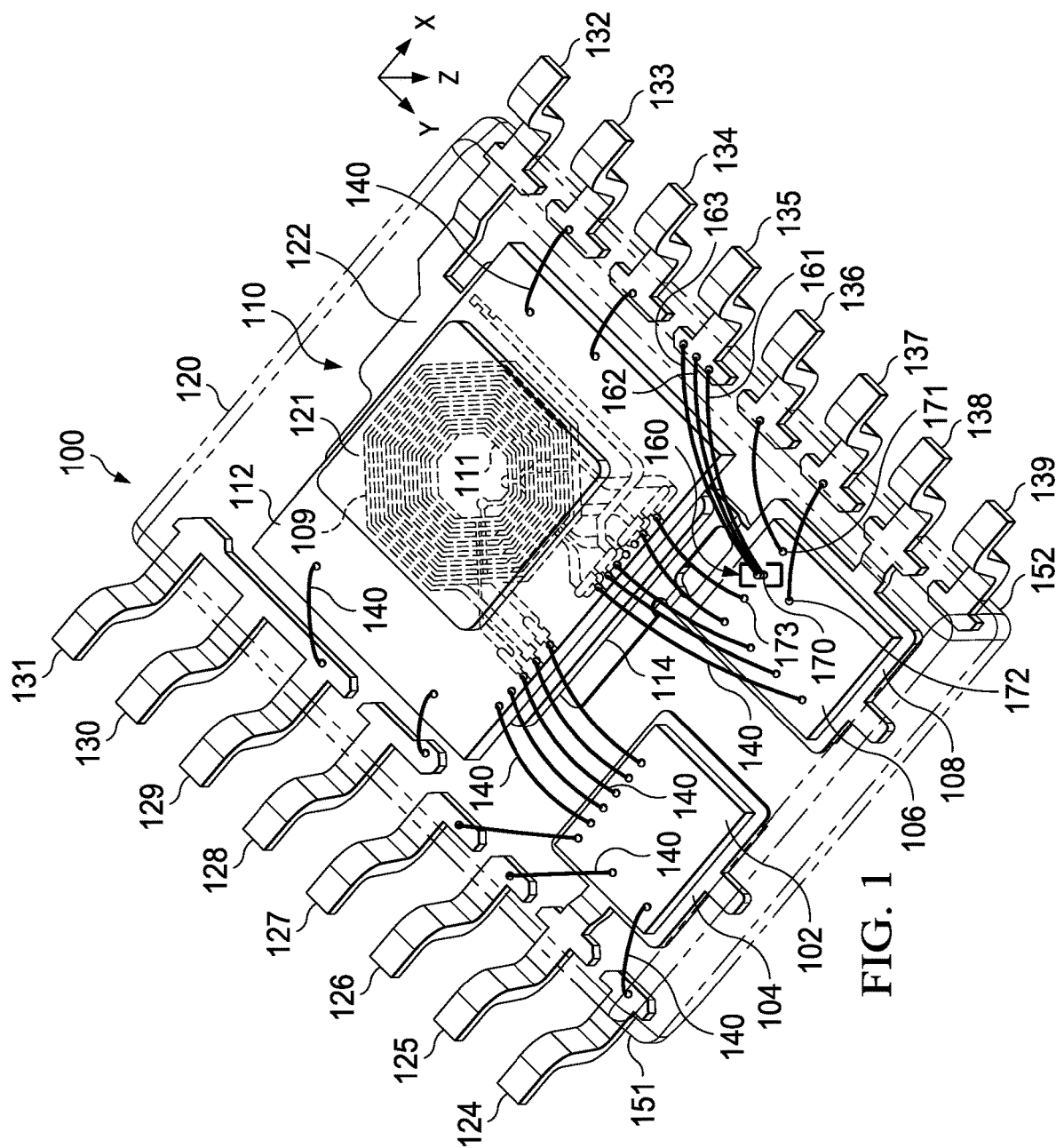
FIG. 1 is a bottom perspective view of a packaged electronic device that includes a semiconductor die with an integrated fuse coupled to a bond pad and a multi-bond stack of bond wire ends coupled to the bond pad.

In the drawings, like reference numerals refer to like elements throughout, and the various features are not necessarily drawn to scale. Also, the term "couple" or "couples" includes indirect or direct electrical or mechanical connection or combinations thereof. For example, if a first device couples to or is coupled with a second device, that connection may be through a direct electrical connection, or through an indirect electrical connection via one or more intervening devices and connections. One or more operational characteristics of various circuits, systems and/or components are hereinafter described in the context of functions which in some cases result from configuration and/or interconnection of various structures when circuitry is powered and operating.

Figure 1A:
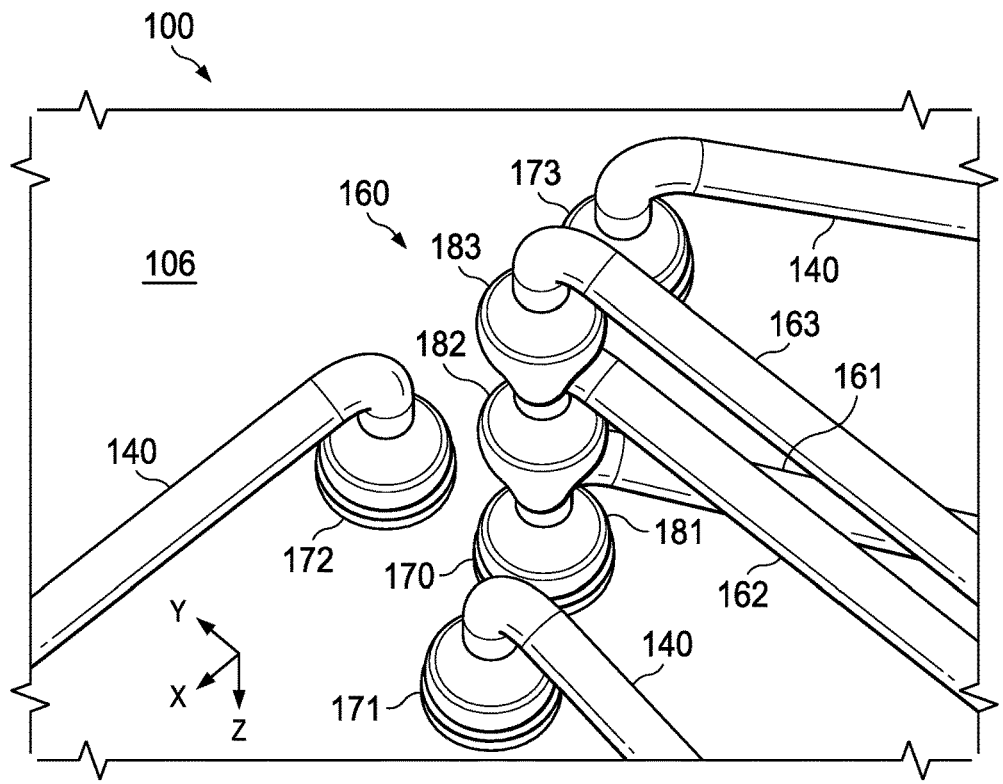
FIG. 1A is a partial perspective view of a portion of the multi-bond stack of bond wire ends coupled to the bond pad.
Figure 1B:
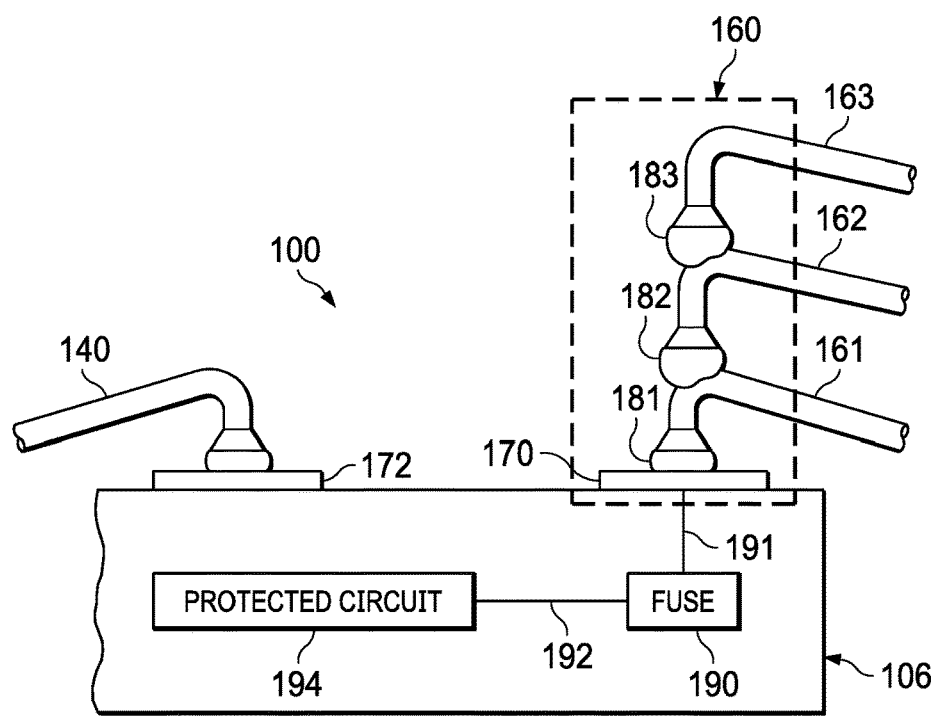
FIG. 1B is a simplified partial side view of a fuse circuit including an implementation of the semiconductor die with an integrated fuse coupled to a bond pad and a multi-bond stack of three bond wire ends coupled to the bond pad.
Figure 1C:
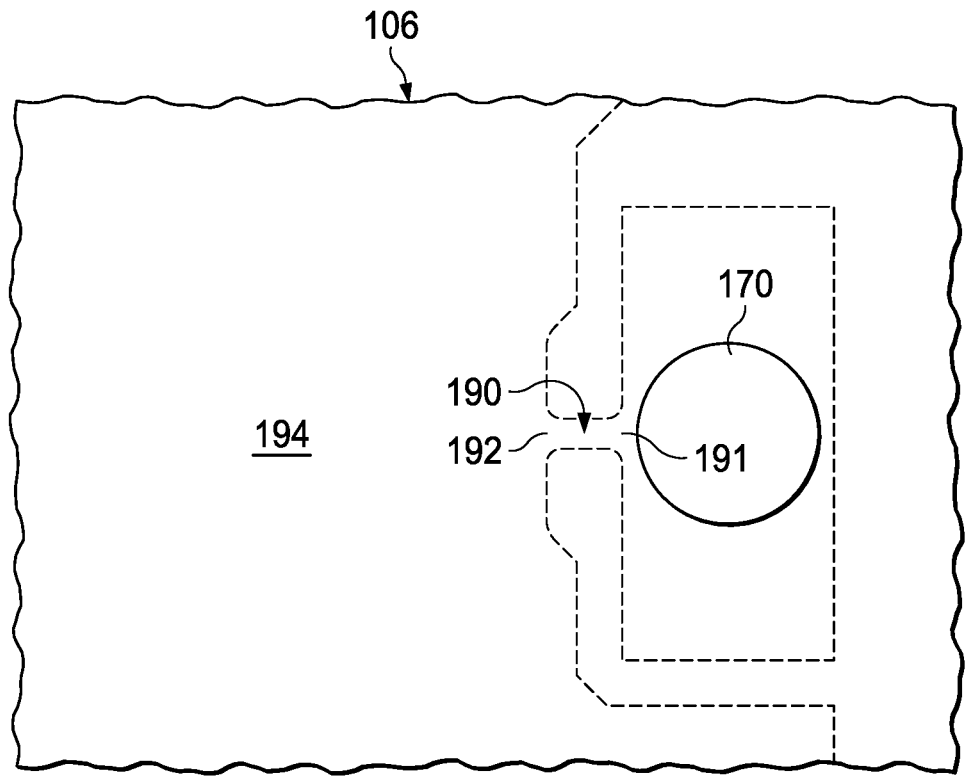
FIG. 1C is a simplified partial top view of the semiconductor die with a first portion of an integrated fuse coupled to a bond pad and a second portion of the fuse coupled to a protected circuit of the semiconductor die.
Figure 1D:
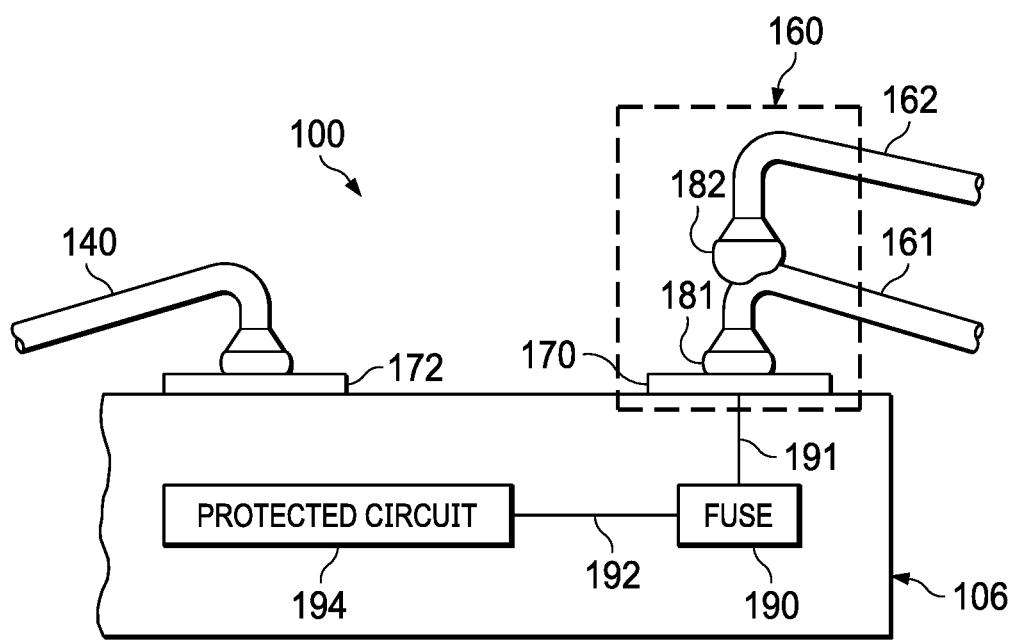
FIG. 1D is a simplified partial side view of a fuse circuit including another implementation of the semiconductor die with an integrated fuse coupled to a bond pad and a multi-bond stack of two bond wire ends coupled to the bond pad.

Referring to FIGS. 1-1D, FIG. 1 shows a bottom perspective view of a packaged electronic device 100 having isolated first and second circuits, a semiconductor die with an integrated fuse coupled to a bond pad 170, and a multi-bond stack 160 of bond wire ends coupled to the bond pad 170. FIG. 1A shows a portion of the multi-bond stack 160 of bond wire ends coupled to the bond pad 170, and FIG. 1B shows a fuse circuit including an implementation of the semiconductor die with an integrated fuse coupled to a bond pad and a multi-bond stack of three bond wire ends coupled to the bond pad. FIG. 1C shows the semiconductor die with a first portion of the integrated fuse coupled to the bond pad 170 and a second portion of the fuse coupled to a protected circuit of the semiconductor die, and FIG. 1D shows a fuse circuit including another implementation of the semiconductor die with an integrated fuse coupled to the bond pad 170 and a multi-bond stack of two bond wire ends coupled to the bond pad 170. The multi-bond stack 160 solves the problem of bond wire failure by increasing the number of bond wires used in the fuse connection to increase current carrying capability, where the bond wires are connected to the same bond pad 170 by stacking without increasing the bond pad size (die real estate) and without additional bond pads and the solutions do not increase the die size.

The electronic device 100 has a small outline integrated circuit (SOIC) package type with conductive terminals, in this case, gull wing leads on opposite first and second sides spaced from one another along a first direction labelled "X" in the drawings. Other packaged electronic devices can be provided in different implementations, including conductive terminals that can be soldered to another structure or structures for electrical interconnections, such as so called leadless package types (e.g., flat no-leads packages such as quad-flat no-leads (QFN), dual-flat no-leads (DFN), micro lead frame (MLF) and small-outline no leads (SON) types with planar conductive terminals (e.g., leads) such as perimeter lands on the package bottom and/or side that provide electrical connections to a printed circuit board (PCB). In other examples, the device 100 includes a ball grid array (BGA) package or a land grid array (LGA) type, such as a mold array process ball grid array (MAPBGA) or an overmolded BGA (e.g., plastic BGA or PBGA) with conductive terminals for electrical connection to other components or circuits.

The electronic device 100 provides electrical interconnections for first and second electrical circuits, some or all of which are implemented using bond wires. In other implementations, different forms of interconnection types can be used, including substrate-based interconnections (BGA, LGA, etc.), and which a substrate includes electrical interconnections and signal routing structures (e.g., copper or aluminum traces on one or more layers or levels) in combination with bond wire electrical connection for the semiconductor fuse circuitry.

As shown in FIG. 1, the example device 100 includes conductive features (e.g., conductive die attach pads or supports) for mounting and supporting first and second semiconductor dies and a laminated magnetic assembly. The die attach pads and device conductive terminals (e.g., leads) can include any suitable conductive structures and materials, such as copper, aluminum, etc. The example device 100 in FIG. 1 includes a first semiconductor die 102 attached to a first conductive die attach pad 104 of a starting lead frame assembly. The device 100 also includes a second semiconductor die 106 attached to a second conductive die attach pad 108.

The electronic device 100 includes a first circuit associated with a first voltage domain (e.g., a high voltage primary circuit of an integrated power device) as well as a second circuit associated with a second voltage domain (e.g., an isolated lower voltage secondary circuit). A first patterned conductive feature 109 has multiple turns in a magnetic assembly 110 to form a first winding (e.g., a primary winding of an isolation transformer of the first circuit). The second circuit in this example includes a secondary winding formed by a second patterned conductive feature 111 (also referred to as a second winding) of the magnetic assembly 110. The magnetic assembly 110 in FIGS. 1-1B includes a multilevel lamination structure 112 having the first and second patterned conductive features 109 and 111. In one example, the multilevel lamination structure 112 is or includes a multilevel package structure. The first and second patterned conductive features 109 and 111 each have multiple turns to form respective first and second windings that extend in respective planes of orthogonal first and second directions X and Y in the position illustrated in the figures. The magnetic assembly 110 also includes one or more magnetic core structures to facilitate forming a magnetic circuit in combination with the patterned conductive features 109 and 111. The illustrated example includes a first (lower or bottom) magnetic core structure 114. The first magnetic core structure 114 is attached to a first (e.g., bottom) side of the multilevel lamination structure 112.

The packaged electronic device 100 also includes a package structure 120 that encloses the conductive die attach pads 104 and 108, the semiconductor dies 102 and 106, the magnetic assembly 110, and portions of conductive terminals (e.g., leads) of the device 100. In one example, the package structure 120 is or includes a molded material, such as plastic. In another example, the package structure 120 is or includes a ceramic material. The magnetic assembly 110 also includes a second (upper or top) magnetic core structure 121 attached to a second (e.g., top) side of the multilevel lamination structure 112. The magnetic assembly 110 is attached to a support structure 122 that is integral to the second conductive die attach pad 108. The packaged electronic device 100 has conductive terminals (e.g., gull-wing shaped conductive leads) 124-131 along one side of the device 100, as well as conductive terminals (e.g., gull-wing shaped leads) 132-139 along an opposite side.

The packaged electronic device 100 also includes bond wires 140, 161, 162, and 163. A first set of the bond wires 140 interconnect certain of the conductive terminals 124-131, the primary winding of the magnetic assembly 110 and the first semiconductor die 102 in a first circuit. A second set of the bond wires 140 interconnect certain of the conductive terminals 132-139, the secondary winding of the magnetic assembly 110 and the second semiconductor die 106 in a second circuit. In the example device 100, the second die attach pad 108, the support structure 122, and the conductive terminals 132 and 138 are a single continuous metal structure, such as copper or aluminum. The package structure 120 encloses the die attach pads 104 and 108, and the associated support structure 122. Also, the package structure 120 encloses inner portions of the conductive terminals 124-139. The conductive terminals 124-139 in one example are so-called gull wing leads that extend downward and outward from the package structure 120. Different types and shapes of conductive terminals can be used in other examples (e.g., J leads). As best shown in FIG. 1, the package structure 120 has respective first and second sides 151 and 152 spaced apart from one another along the first direction (e.g., the X direction). The first conductive terminals 124-131 are located along, and extend outward from (e.g., outside of), the first side 151 of the package structure 120, and the second conductive terminals 132-139 are located along, and extend outward from (e.g., outside of), the second side 152 of the package structure 120.

The electronic device 100 includes a multi-bond stack 160 of bond wire ends of bond wires 161, 162 and 163 coupled to a bond pad 170 of the second semiconductor die 106. The bond pad 170 is a conductive metal, such as copper or aluminum with a top side exposed outside the package structure 120 to allow electrical connection to bond wires, stud bumps, etc. The second semiconductor die 106 includes other bond pads 171, 172, and 173 coupled to corresponding bond wires 140, as well as further bond pads that are not numerically designated in the figures. FIG. 1A shows a portion of the multi-bond stack 160 with first ends of the bond wires 161, 162 and 163 forming the stacked bond wire end arrangement coupled to the bond pad 170. FIG. 1B shows a fuse circuit including the semiconductor die 106 with an integrated fuse 190 coupled to the bond pad 170 and the multi-bond stack 160 of three bond wire ends coupled to the bond pad 170. FIG. 1C shows the semiconductor die with a first portion of the integrated fuse coupled to the bond pad 170 and a second portion of the fuse coupled to a protected circuit of the semiconductor die.

The configuration shown in FIGS. 1-1C has a multi-bond stack 160 of three bond wire ends coupled to the bond pad 170. The semiconductor die 106 in this example has an integrated fuse 190 with a first portion 191 and a second portion 192. The bond pad 170 is coupled to the first portion 191 of the fuse 190. The semiconductor die 106 also includes a protected circuit 194 coupled to the second portion 192 of the fuse 190. As shown in the top view of FIG. 1C, the fuse 190 in one example is a narrow patterned conductive feature of a metallization layer of the die 106 between wider features of the protected circuit 194 and a feature coupled to the externally extending bond pad 170. In one example, the fuse electrically couples a supply voltage signal to the protected circuit. The supply voltage signal in this example is provided to the conductive terminal 135 of FIG. 1, for example, from a circuit of a printed circuit board (PCB, not shown) to which the packaged electronic device 100 is soldered. The conductive terminal 135 is coupled to the protected circuit 194 via the electrically parallel connection of the first bond wire 161, the second bond wire 162, and the third bond wire 163, the bond pad 170, and the fuse 190.

The bond wires 161, 162 and 163 have respective first ends electrically coupled to the bond pad 170 and to one another by respective bonds 181, 182, and 183 to form the example multi-bond stack 160. The first bond wire 161 is enclosed by the package structure 120 and has first and second ends (e.g., FIG. 1). The first end of the first bond wire 161 is coupled to the bond pad 170 by the first bond 181. In one example, the first bond 181 is the first bond created during formation and connection of the first wire bond 161, referred to herein as a ball bond. In another example, the first bond 181 is the second or final bond created during formation and connection of the first wire bond 161, referred to herein as a stitch bond. In another example, a conductive stud bump is formed on the bond pad 170 (e.g., using a wire bonding system), and the first end of the first bond wire 161 is coupled (e.g., bonded) to the stud bump to couple the first end of the first bond wire 161 to the bond pad 170. The second end of the first bond wire 161 is coupled to the conductive terminal 135, for example, by a stitch bond or a ball bond, or using a stud bump (not shown).

Figure 10:
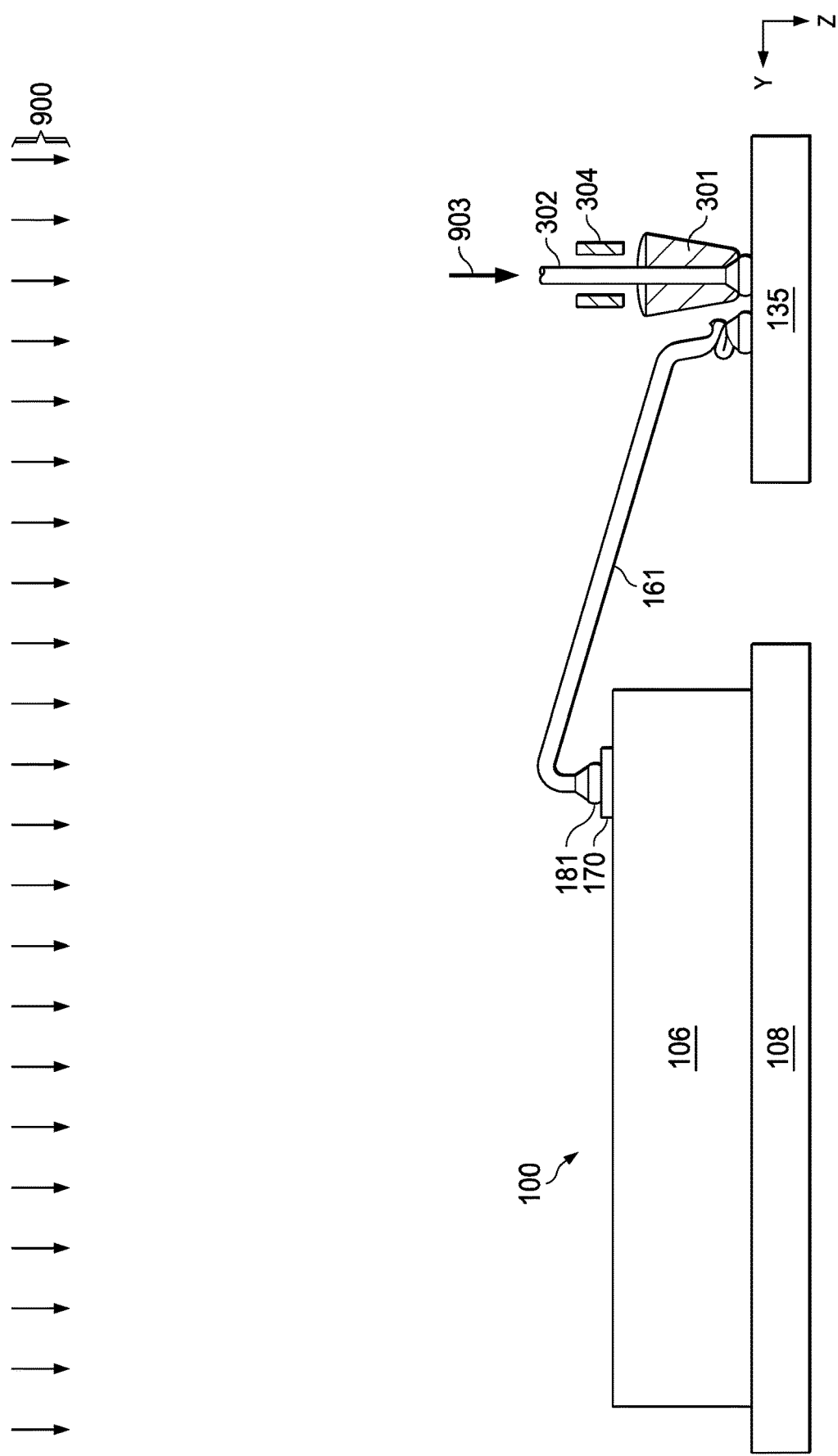

The second bond wire 162 is enclosed by the package structure 120 and has first and second ends. The first end of the second bond wire 162 is coupled to the first end of the first bond wire 161. In one example, the first end of the second bond wire 162 is bonded to the first end of the first bond wire 161 by the second bond 182. In one example, the second bond 182 is a ball bond. In another example, the second bond 182 is a stitch bond. The second end of the second bond wire 162 is coupled to the conductive terminal 135, for example, by a stitch bond or a ball bond, or the first bond 181 is formed on a stud bump (not shown). In one example, the second end of the second bond wire 162 is bonded directly to the conductive terminal 135 at a location laterally spaced from the second end of the first bond wire 161, for example, as shown in FIG. 10 below. In another example, the second end of the second bond wire 162 is bonded to the second end of the first bond wire 161.

Figure 19:
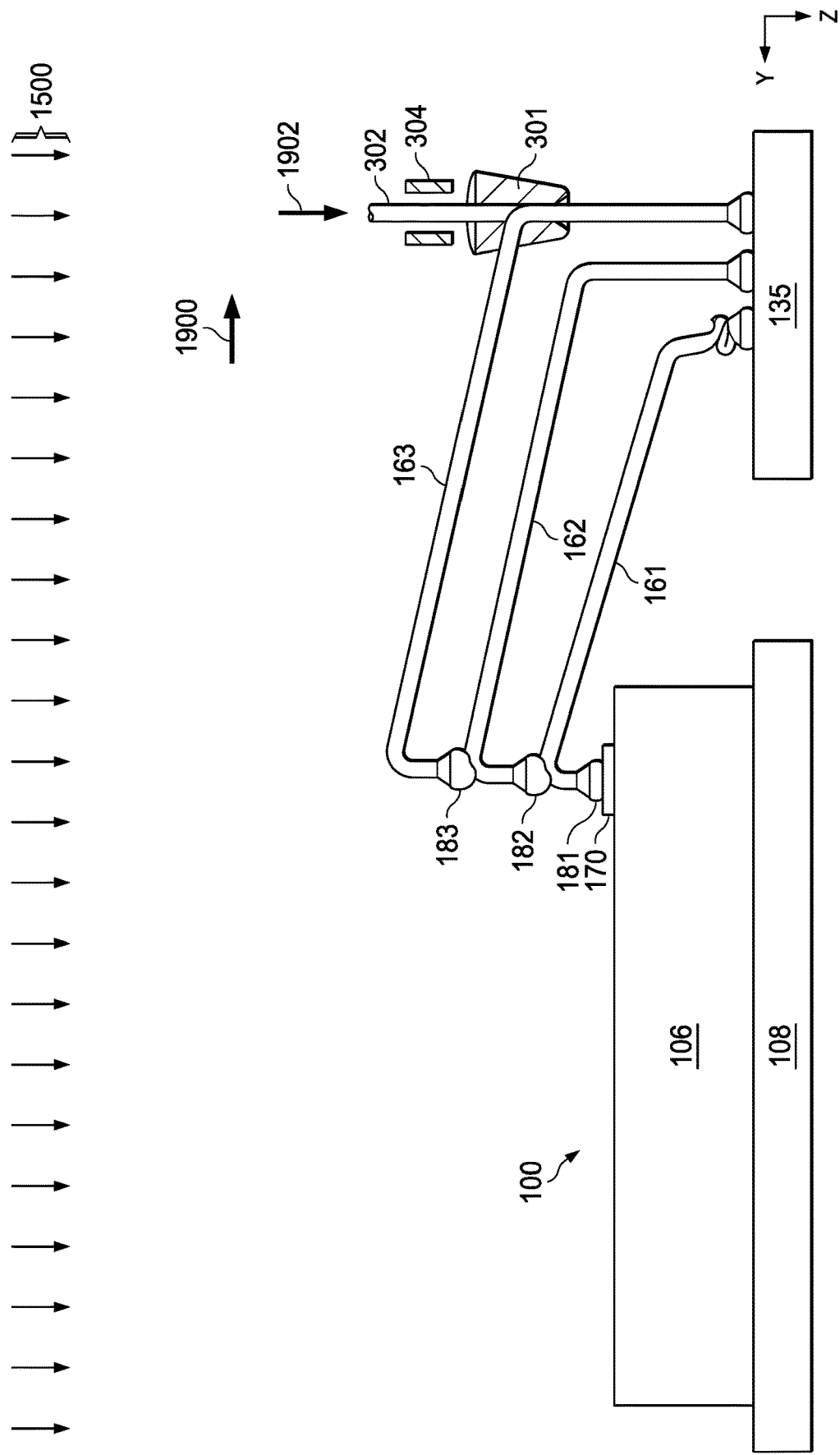

The third bond wire 163 is enclosed by the package structure 120 and has first and second ends. The first end of the third bond wire 163 is coupled to the first end of the second bond wire 162 to form the multi-bond stack 160 of three bond wire ends coupled to the bond pad 170. In the example of FIGS. 1-1B, the first end of the third bond wire 163 is bonded to the first end of the second bond wire 162 by the third bond 183. In one example, the third bond 183 is a ball bond. In another example, the third bond 183 is a stitch bond. The second end of the third bond wire 163 is coupled to the conductive terminal 135, for example, by a stitch bond or a ball bond, or using a stud bump (not shown). The second end of the third bond wire 163 in one example is bonded directly to the conductive terminal 135 at a location laterally spaced from the second end of the first bond wire 161, for example, as shown in FIG. 19 below. In another example, the second end of the third bond wire 163 is bonded to the second end of the first bond wire 161 or to the second end of the second bond wire 162, for example, by a stitch bond or a ball bond.

This arrangement facilitates increasing the effective current carrying capability of the bond wire coupling between the conductive terminal 135 and the bond pad 170 without increasing the size of the bond pad 170 and without increasing the associated die area. In various examples, one, some or all of the first, second, and third bonds 181, 182, 183 are ball bonds. In these or other examples, one, some or all of the first, second, and third bonds 181, 182, 183 are stitch bonds. In some examples, the first, second, and third bonds 181, 182, 183 include combinations of ball bonds and stitch bonds.

In various possible implementations, more or fewer than three bond wires can be used to create the multi-bond stack 160 that couples two or more bond wires to the bond pad 170. FIG. 1D shows one example with a fuse circuit including another implementation of the semiconductor die 106 that includes an integrated fuse 190 coupled to the bond pad 170 and a multi-bond stack of two bond wire ends coupled to the bond pad 170. In the above examples, the protected circuit 194 is integrated in the semiconductor die 106. In other examples, the semiconductor die 106 includes the fuse 190 and the protected circuit 194 is external to the semiconductor die 106. The multi-bond stack 160 solves the problem of bond wire failure by increasing the number of bond wires used in the fuse connection to increase current carrying capability, where the bond wires are connected to the same bond pad 170 by stacking without increasing the bond pad size (die real estate) and without additional bond pads and the solutions do not increase the die size.

Referring now to FIGS. 2-20, FIG. 2 shows a method 200 of fabricating an electronic device, and FIGS. 3-20 show the electronic device 100 undergoing fabrication processing to form the multi-bond stack of three bond wire ends coupled to the bond pad 170 according to the method 200. The method 200 includes fabricating the magnetic assembly 110 at 201, 202, 204 and 206, including fabricating the multi-level lamination structure 112 at 201, for example, as a multilevel lamination structure 112. The method 200 continues at 202 with attaching the top magnetic core structure 114 to the top side of the multilayer lamination structure 112, for example, using epoxy or another suitable adhesive and attachment of the second magnetic core structure 121 to the opposite bottom side of the multilayer lamination structure 112 at 204. The method 200 in one example further includes separating (e.g., singulating) the magnetic assembly at 206, where the lamination structure 112 is diced or cut to singulate or separate individual laminated magnetic assemblies 110 (not shown) from the initial unitary structure, for example, using a saw blade, etching, laser cutting, etc.

At 208, the magnetic assembly 110 is attached to the support structure 122 of a starting lead frame, for example, a panel with an array of rows and columns of prospective device areas processed concurrently. In one example, a lead frame structure is provided that includes the support structure 122, conductive terminals (e.g., 124-139 in FIG. 1) and conductive die attach pads 104 and 108. In one implementation, the lead frame structure is provided on a tacky tape or other adhesive carrier, with the various constituent structures assembled in a predetermined relative arrangement to facilitate subsequent assembly steps in the method 200. The process 200 continues at 210 and 212 in FIG. 2 with attaching semiconductor dies to corresponding die attach pads, for example, using adhesive or soldering. The attachment process at 210 attaches the first semiconductor die 102 to the first die attach pad 104 in the orientation shown in FIG. 1 above. At 212, the processing attaches the second semiconductor die 106 to the corresponding second die attach pad 108 as shown in FIG. 1.

The method 200 also includes performing a wire bonding process at 214, as further illustrated in FIGS. 3-20. FIG. 1 shows one example in which the wire bond connections 140 are formed between the semiconductor dies 102, 106 and one or more conductive terminals and/or exposed conductive features of the magnetic assembly 110 to form the first and second circuits, in addition to formation of the bond wires 161-163. In certain examples, the wire bonding processing at 214 can be performed using supporting structures to provide mechanical structural support for one or more features of the magnetic assembly 110 during bond wire attachment. FIGS. 3-6 show formation and coupling of the first bond wire 161. The wire bonding process in one example includes coupling the first end of the first bond wire 161 to the bond pad 170 at 216. In one implementation, a stud bump is formed at 215 on the bond pad 170, and the first end of the first bond wire 161 is coupled at 216 to the stud bump. In the illustrated example of FIGS. 3-6, the stud bump formation at 215 is omitted. The first end of the first bond wire 161 is coupled at 216 to the bond pad 170 by the first bond 181, in this case a ball bond 181, and the second end of the first bond wire 161 is coupled to the conductive terminal 135 by a stitch bond to form the first bond wire 161 between the bond pad 170 and the conductive lead 135 at 216.

Figure 3:
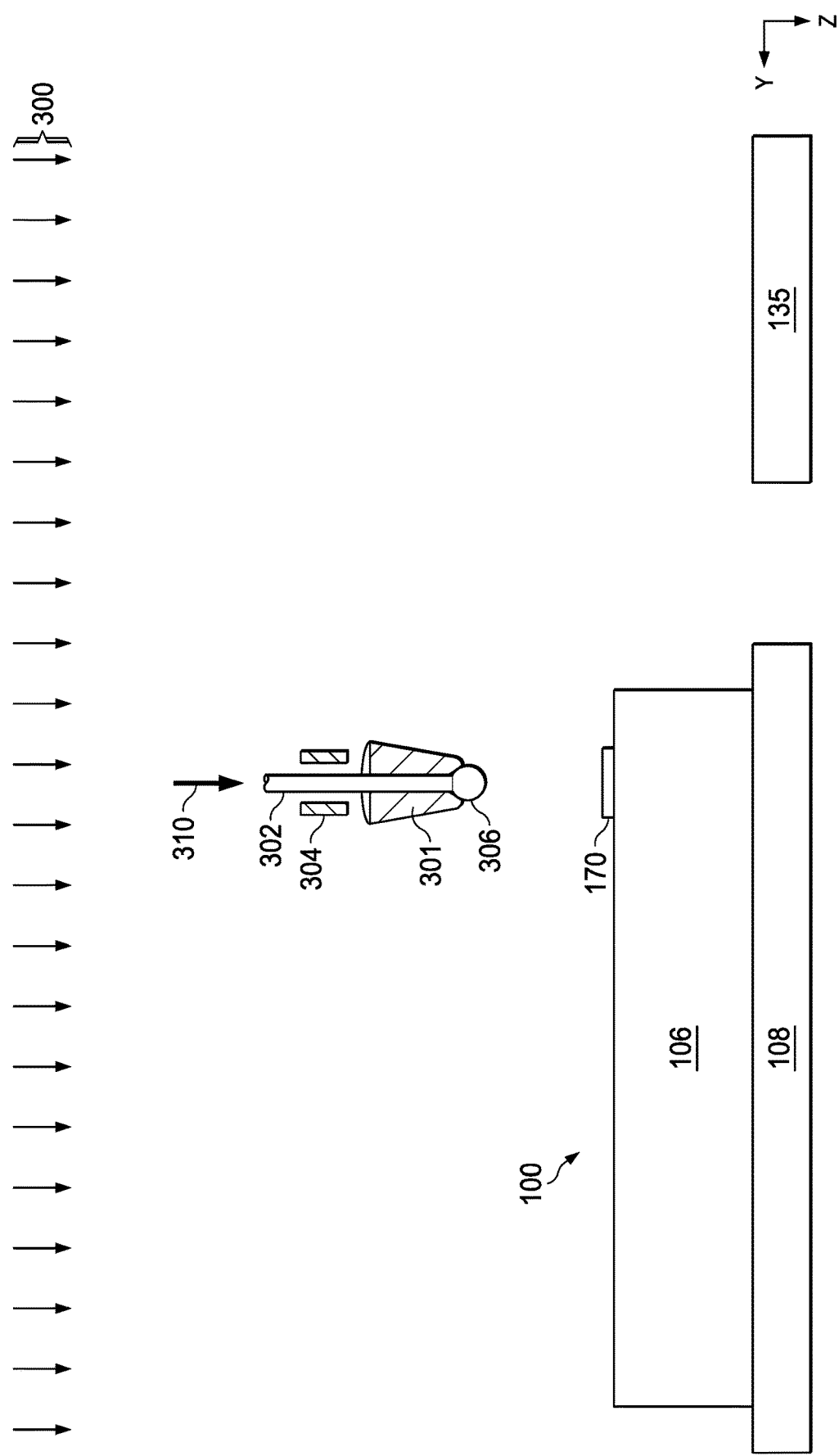
FIGS. 3-20 are partial side elevation views of the electronic device of FIGS. 1-1C undergoing fabrication processing to form the multi-bond stack of three bond wire ends coupled to the bond pad according to the method of FIG. 2.
Figure 4:
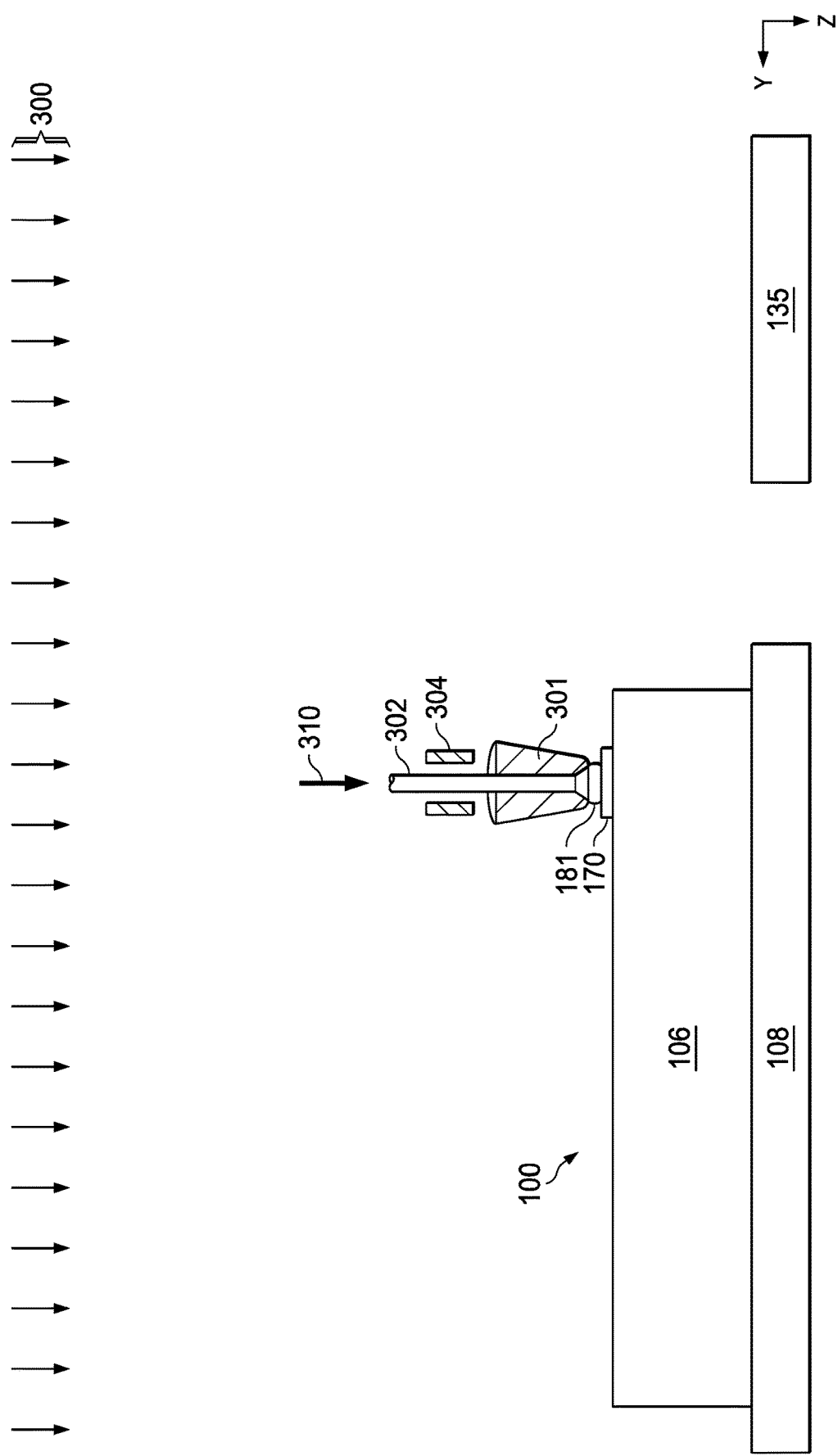

The first bond wire formation processing at 216 begins in FIG. 3 with a first bond wire formation process 300. A position control apparatus (not shown) moving a nozzle 301 close to an electronic flame source (not shown). The electronic flame source is energized to form a flame or arc to melt the end of a conductive wire 302 to form a ball 306 suspended by the remainder of the wire 302 while a clamp 304 remains closed. The clamp 304 is opened as shown in FIG. 3, and the position control apparatus moves the nozzle 301 downward in FIG. 3 along the direction 310 to move the ball 306 toward the bond pad 170 of the second semiconductor die 106 with the clamp 304 open. The downward movement of the nozzle 301 continues with the ball 306 touching the top side of the bond pad 170 in FIG. 4 and progressively collapses and laterally spreading to form the first bond 181 (e.g., a ball bond) while the clamp 304 remains open. The ball bond joins a first end of the prospective first bond wire 161 to the top side of the bond pad 170. In one example, the position control apparatus vibrates the nozzle at high (e.g., ultrasonic) frequencies to bond the ball 306 to the top side of the bond pad 170 as shown in FIG. 4, including lateral movement of the nozzle 301 back and forth along the X direction, or in a circular pattern in an X-Y plane, to form the ball bond 181.

Figure 5:
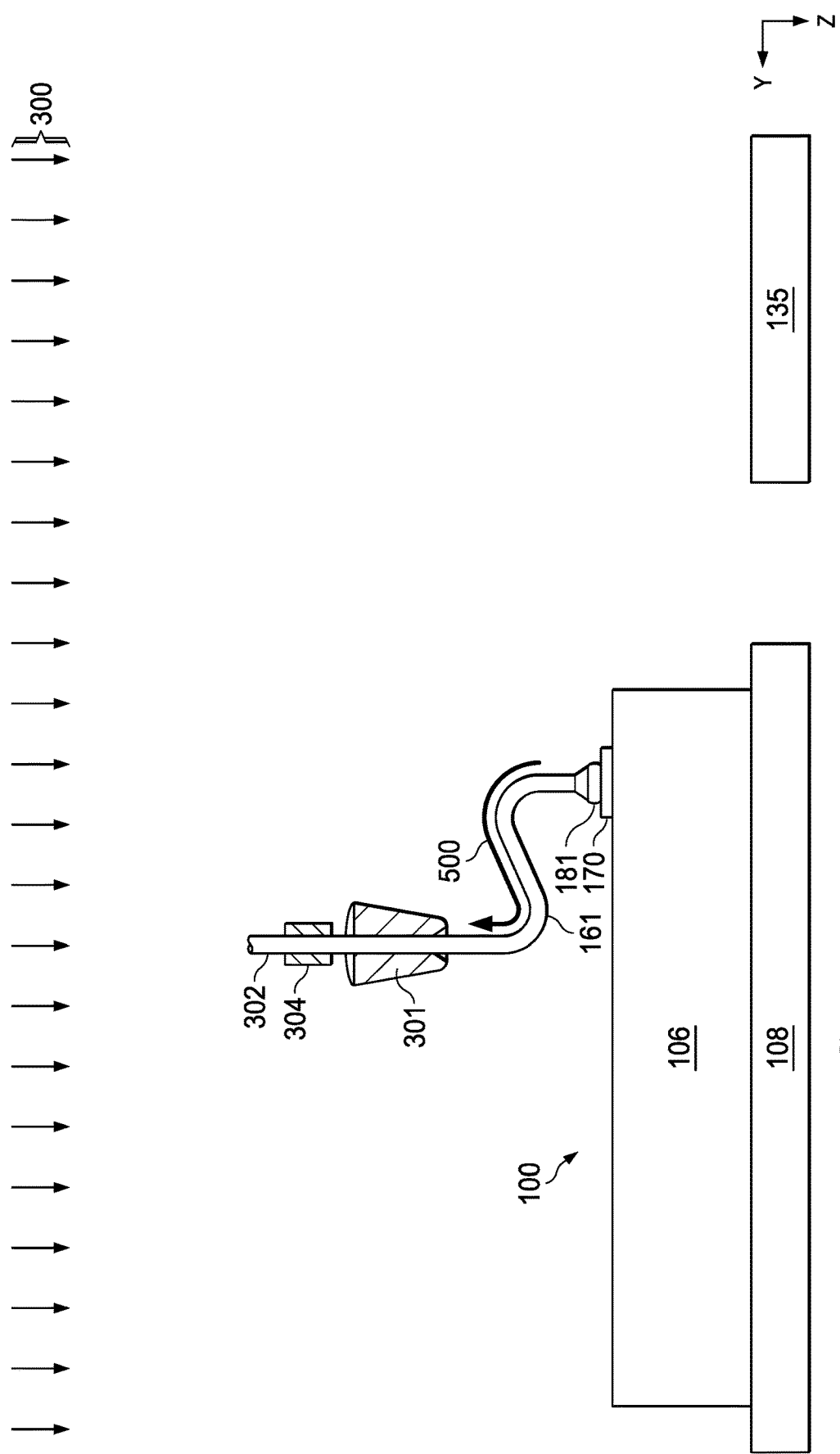
Figure 6:
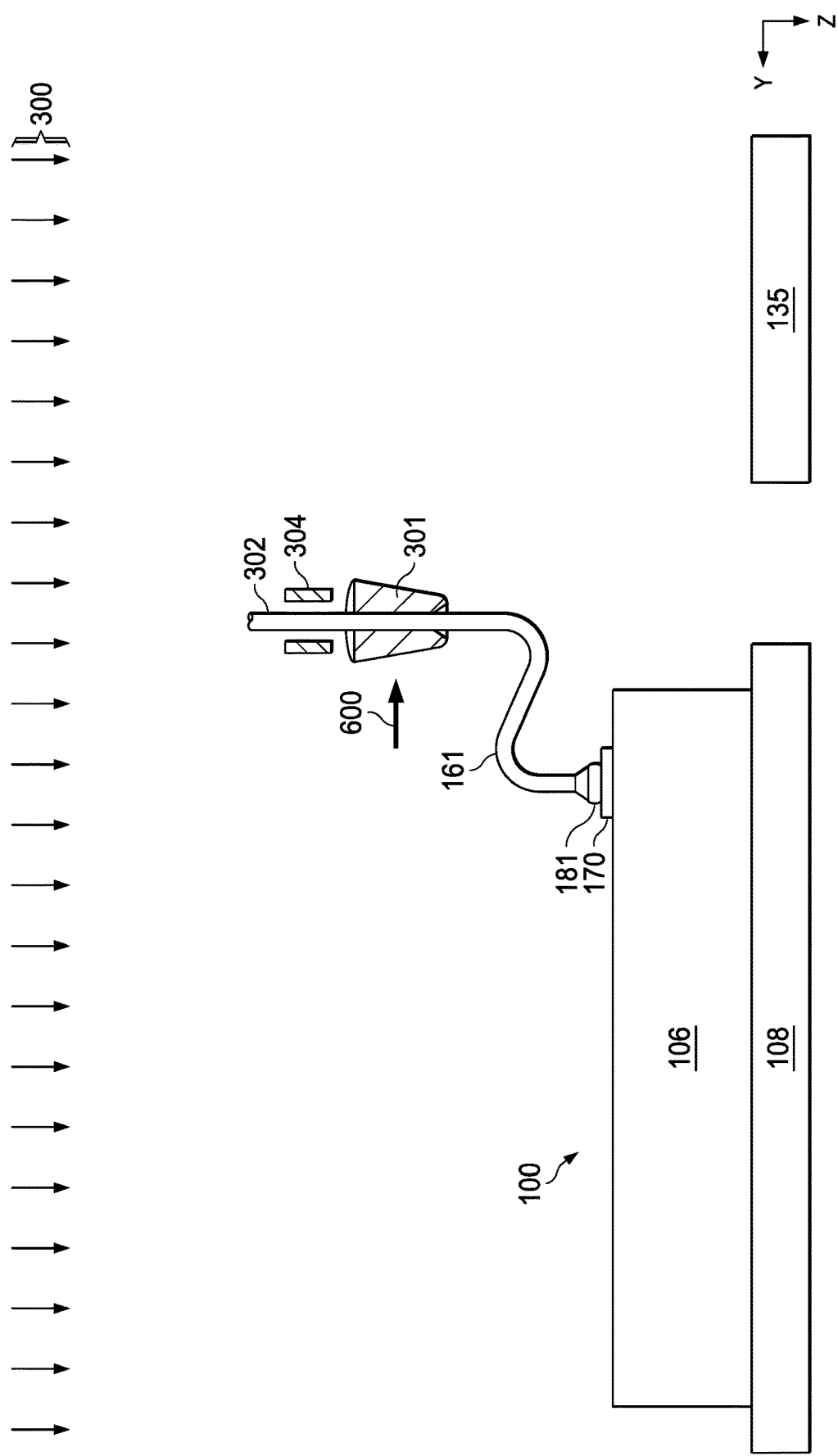

The first bond wire formation process 300 continues in FIG. 5 where the position control apparatus extends the first bond wire 161 upward and laterally away from the bond pad 170 along a direction of arrow 500 with the clamp 304 open, and then the clamp 304 is closed and the position control apparatus moves the nozzle 301 toward the conductive terminal 135 along the direction 600 in FIG. 6 while the clamp 304 remains closed.

Figure 7:
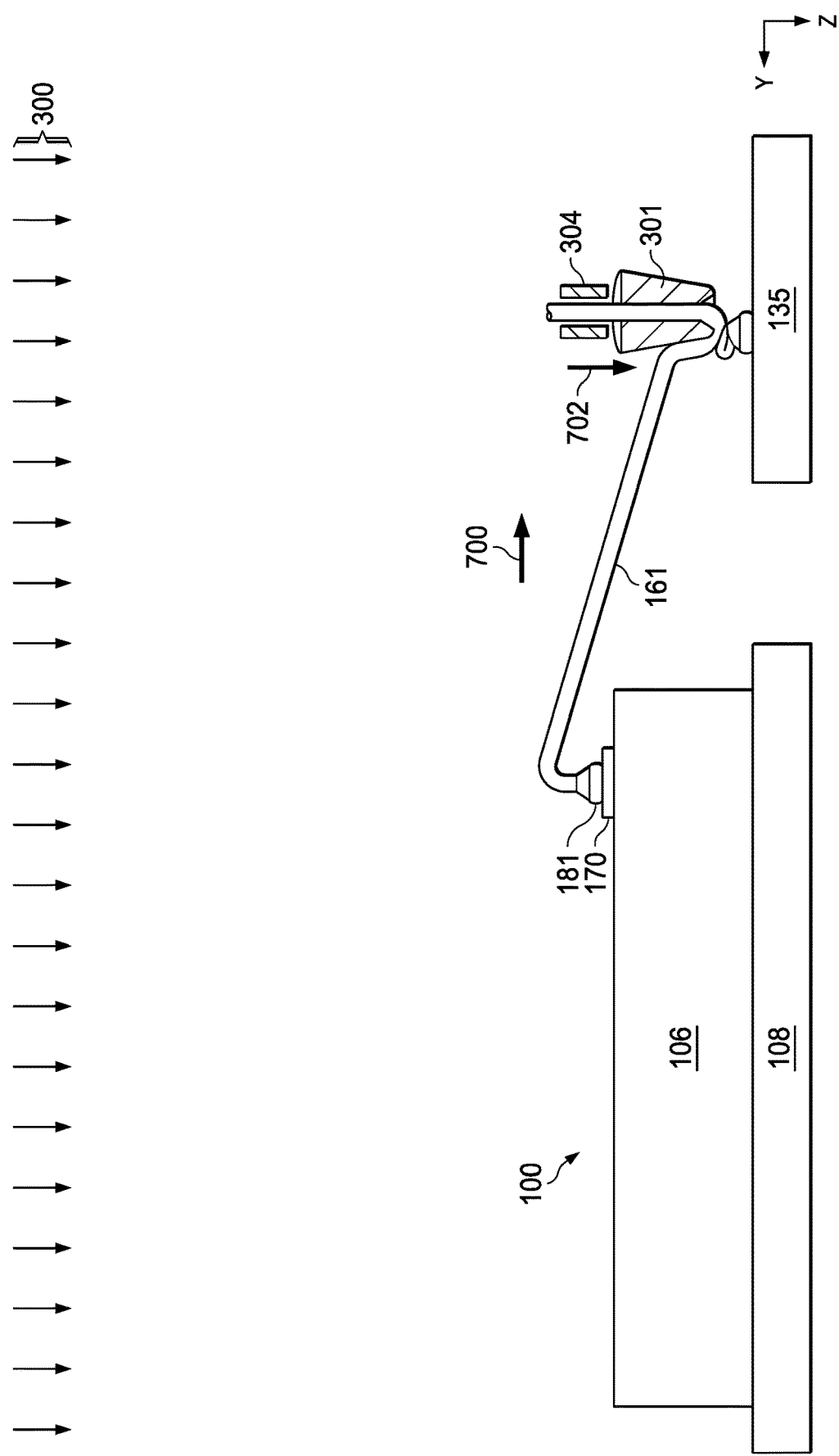
Figure 8:
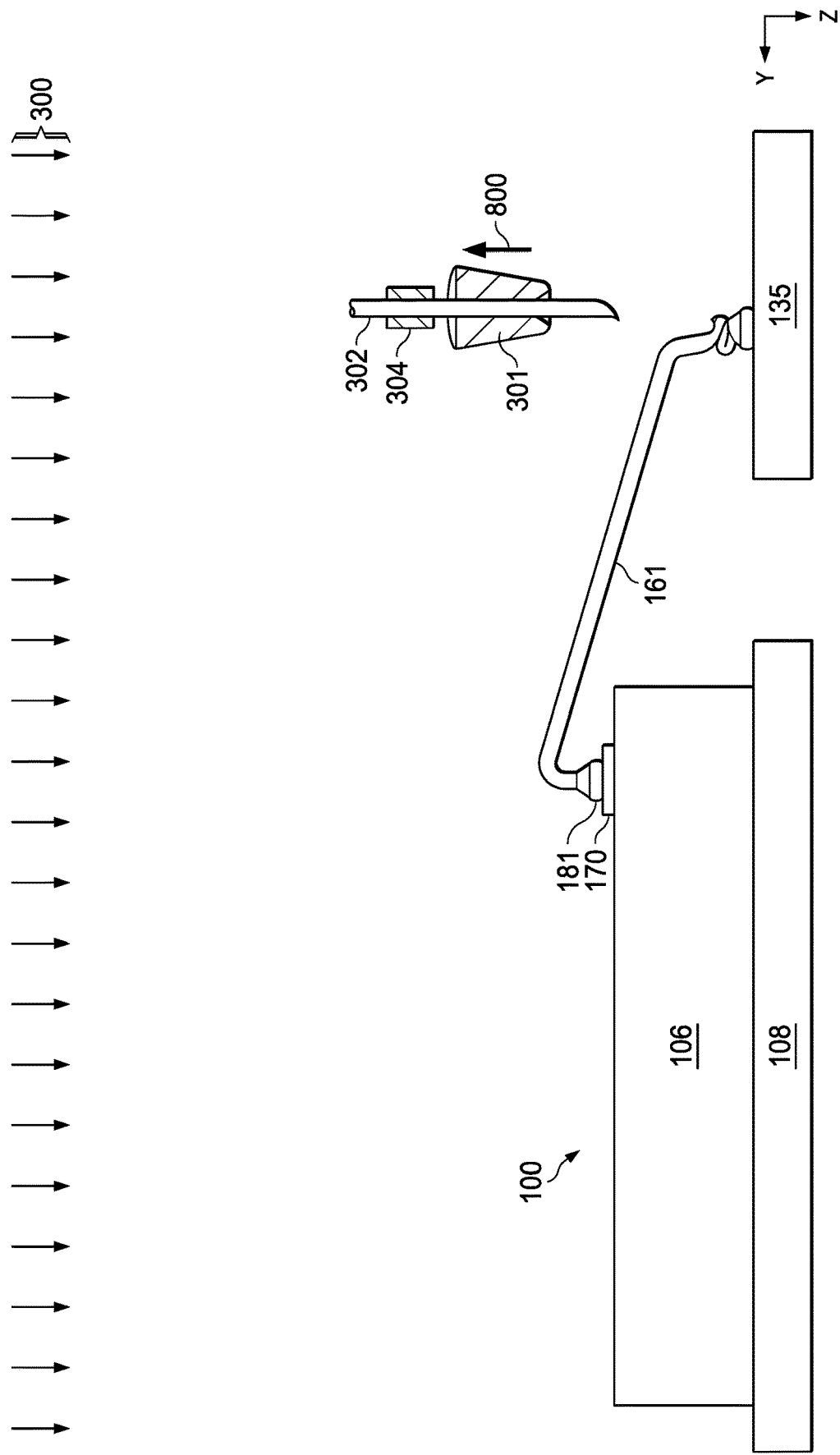

The process 300 continues in FIG. 7 with the position control apparatus moving the nozzle 301 further laterally along the direction 700 until the center of the bond wire 161 in the nozzle 301 is positioned above a first portion of the conductive terminal 135 and then downward along the direction 702 to cause the second end of the first bond wire 161 to contact the conductive terminal 135 as shown in FIG. 7. In one example, the position control apparatus vibrates the nozzle at high (e.g., ultrasonic) frequencies to bond the second end of the conductive first bond wire 161 to the first portion of the top of the conductive terminal 135, for example, including lateral movement of the nozzle 301 back and forth along the X direction, or in a circular pattern in an X-Y plane, to form the stitch bond connection. In FIG. 8, with the clamp 304 opened, the position control apparatus moves the nozzle 301 upward along the direction 800. As shown in FIG. 8, the position control apparatus closes the clamp 304 and raises the nozzle 301 upward along the direction 800 further away from the conductive terminal 135 to separate or break the wire in the nozzle 301 from the second end of the first bond wire 161 to complete the stitch bond.

Figure 2:
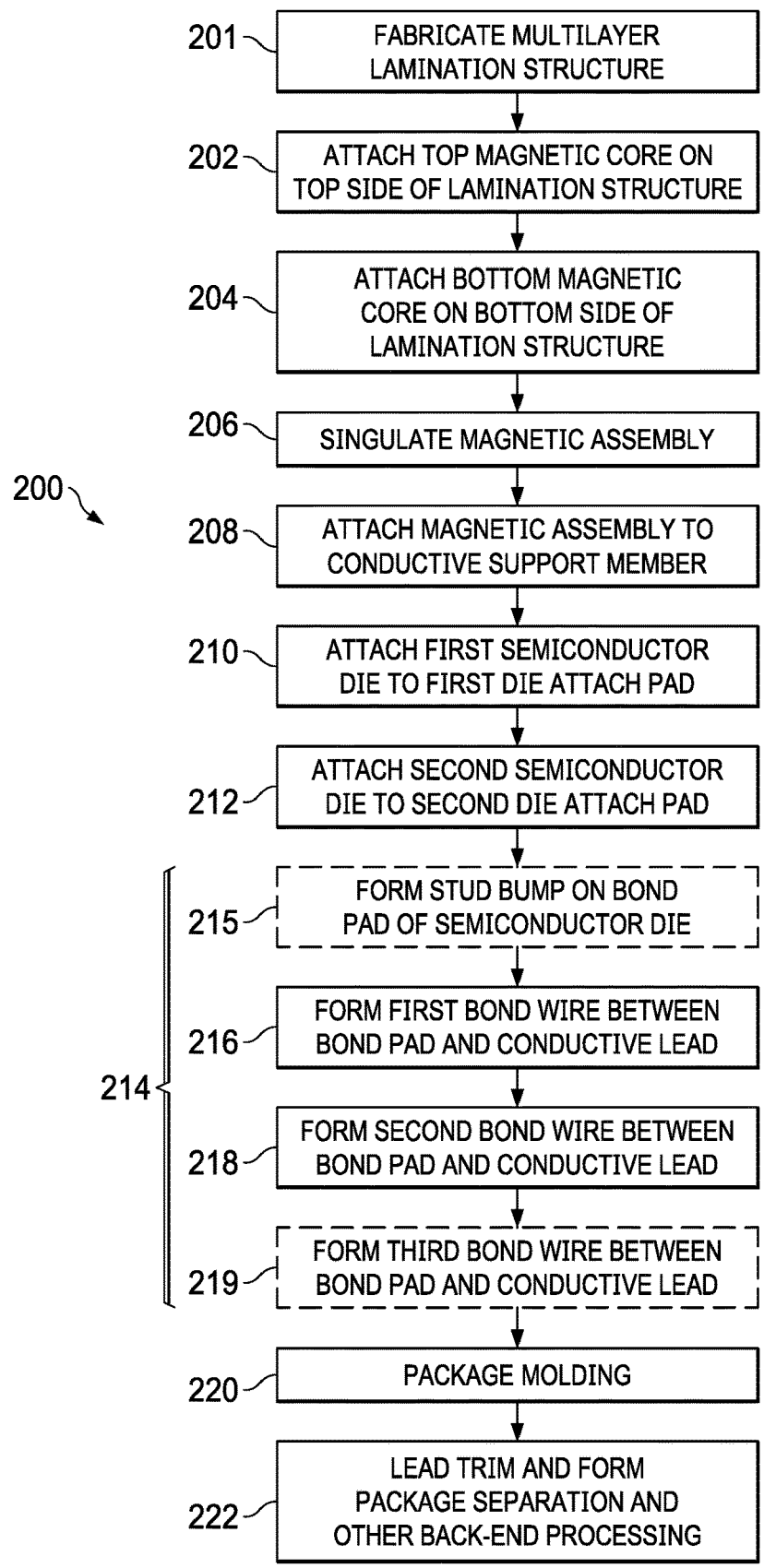
FIG. 2 is a flow diagram of a method of fabricating an electronic device.
Figure 9:
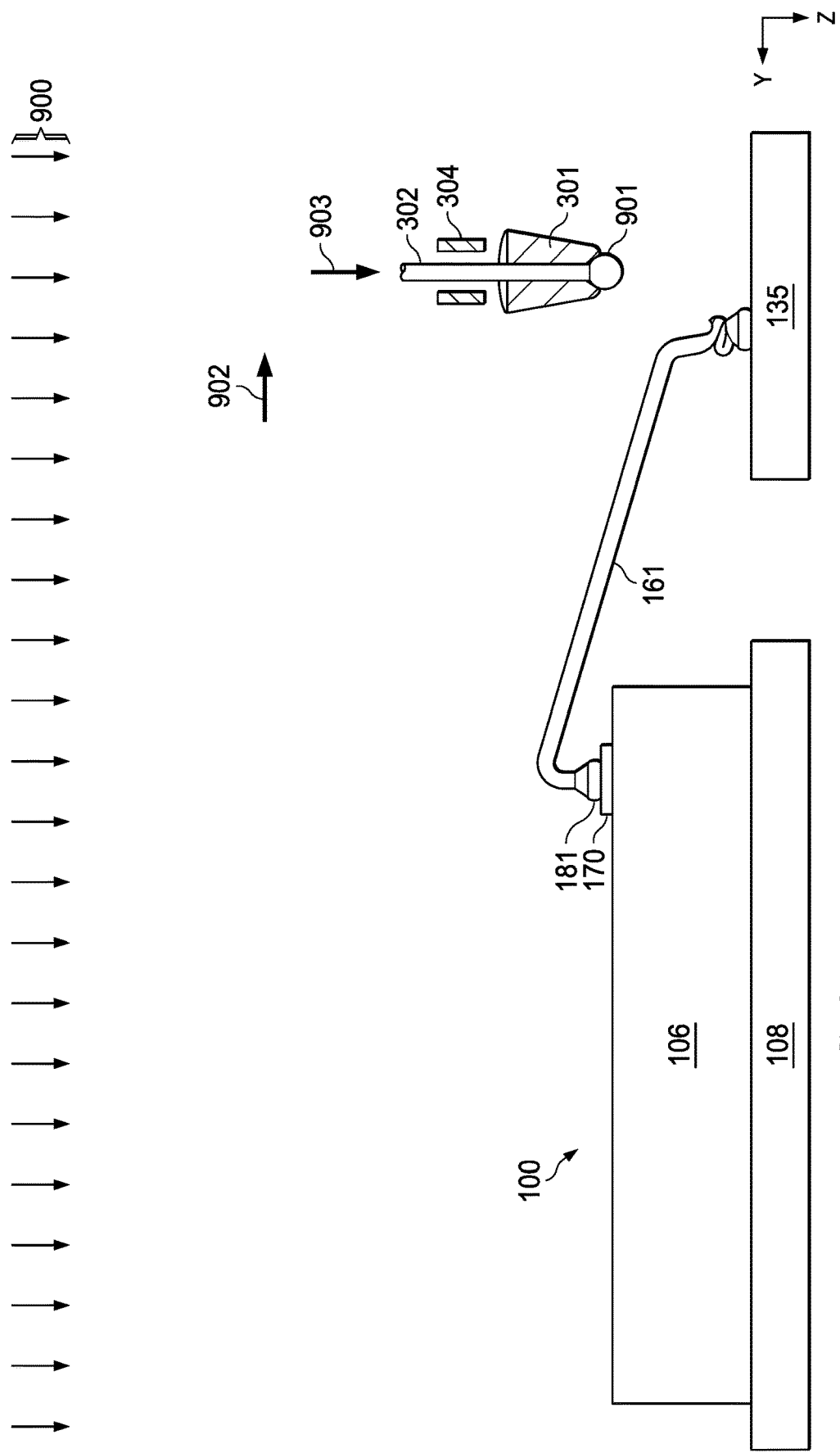

At 218 in FIG. 2, the method 200 includes forming the second bond wire 162 between the bond pad 170 and the conductive lead 135. Referring also to FIGS. 9-14, the second bond wire formation processing begins at 218 with a second bond wire formation process 900 in FIG. 9. The position control apparatus moves the nozzle 301 close to the electronic flame source, which is energized to form a flame or arc to melt the end of the conductive wire 302 to form a ball 901 suspended by the remainder of the wire 302 while the clamp 304 is closed. The clamp 304 is opened as shown in FIG. 9, and the position control apparatus moves the nozzle 301 laterally along a direction 902 above a second portion of the conductive terminal 135 and downward along a direction 903 to move the ball 901 toward the second portion of the conductive terminal 135 with the clamp 304 open. The downward movement of the nozzle 301 continues with the ball 901 touching the top side of the second portion of the conductive terminal 135 in FIG. 10. The ball 901 progressively collapses and laterally spreads to form a ball bond while the clamp 304 remains open. The ball bond joins a second end of the prospective second bond wire 162 to the top side of the top side of the second portion of the conductive terminal 135. In one example, the position control apparatus vibrates the nozzle at high (e.g., ultrasonic) frequencies to bond the ball 901 to the top side of the second portion of the conductive terminal 135 as shown in FIG. 10, including lateral movement of the nozzle 301 back and forth along the X direction, or in a circular pattern in an X-Y plane, to form the ball bond.

Figure 11:
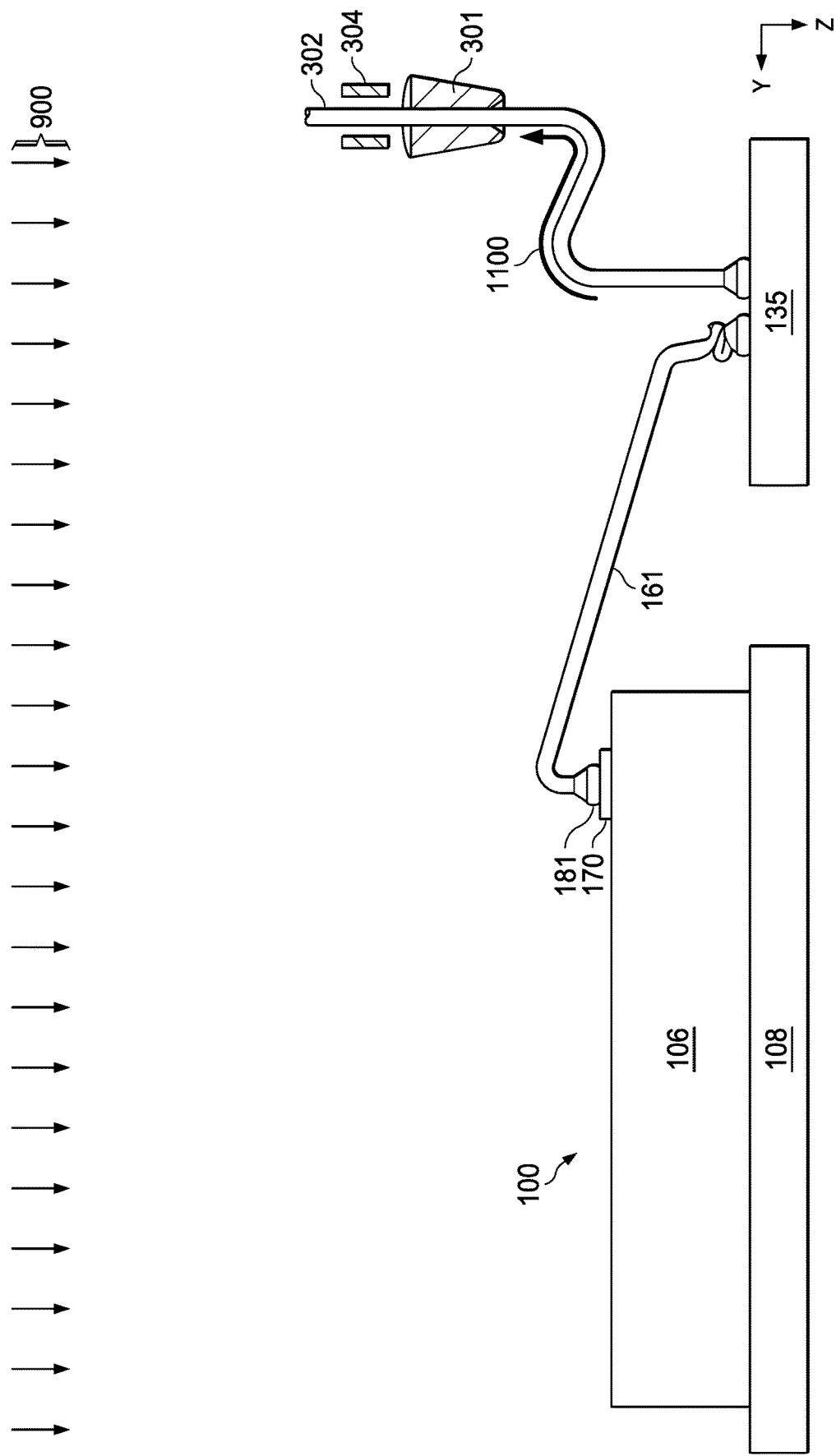
Figure 12:
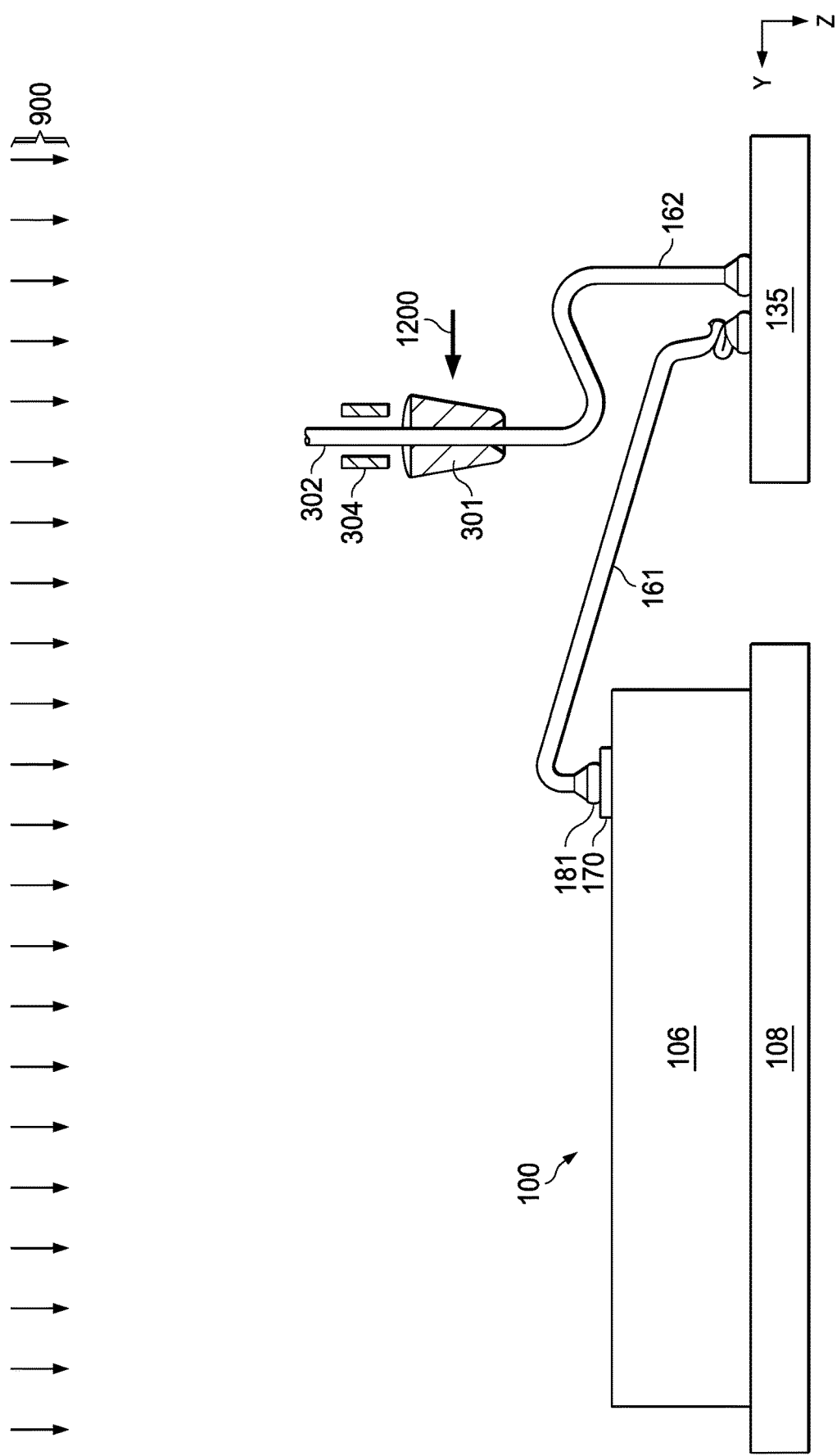

The second bond wire formation process 900 continues in FIG. 11 where the position control apparatus extends the second bond wire 162 upward and laterally away from the conductive terminal 135 along a direction of arrow 1100 with the clamp 304 open. The clamp 304 is closed and the position control apparatus moves the nozzle 301 toward the bond pad 170 along the direction 1200 in FIG. 12 while the clamp 304 remains closed.

Figure 13:
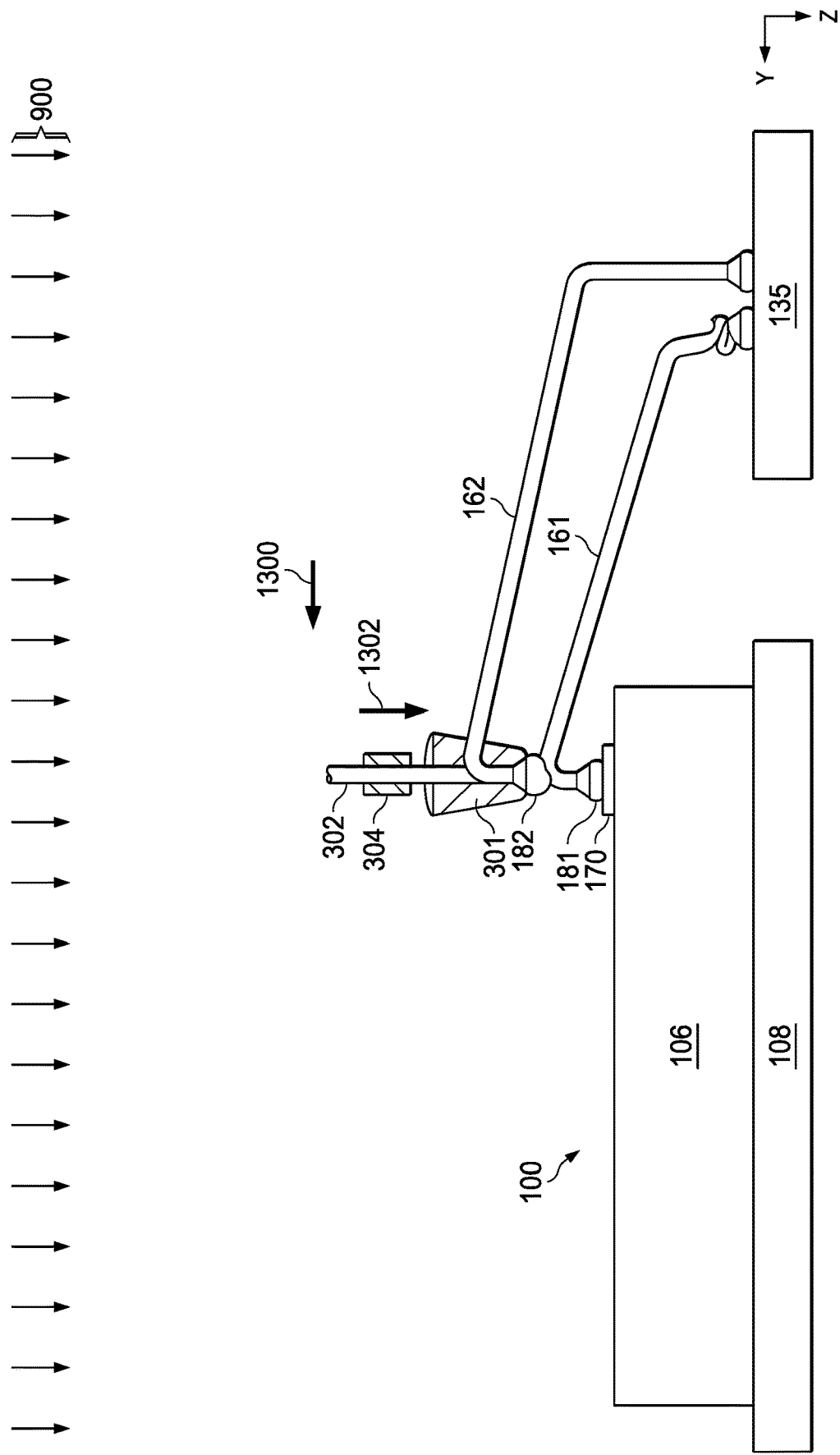
Figure 14:
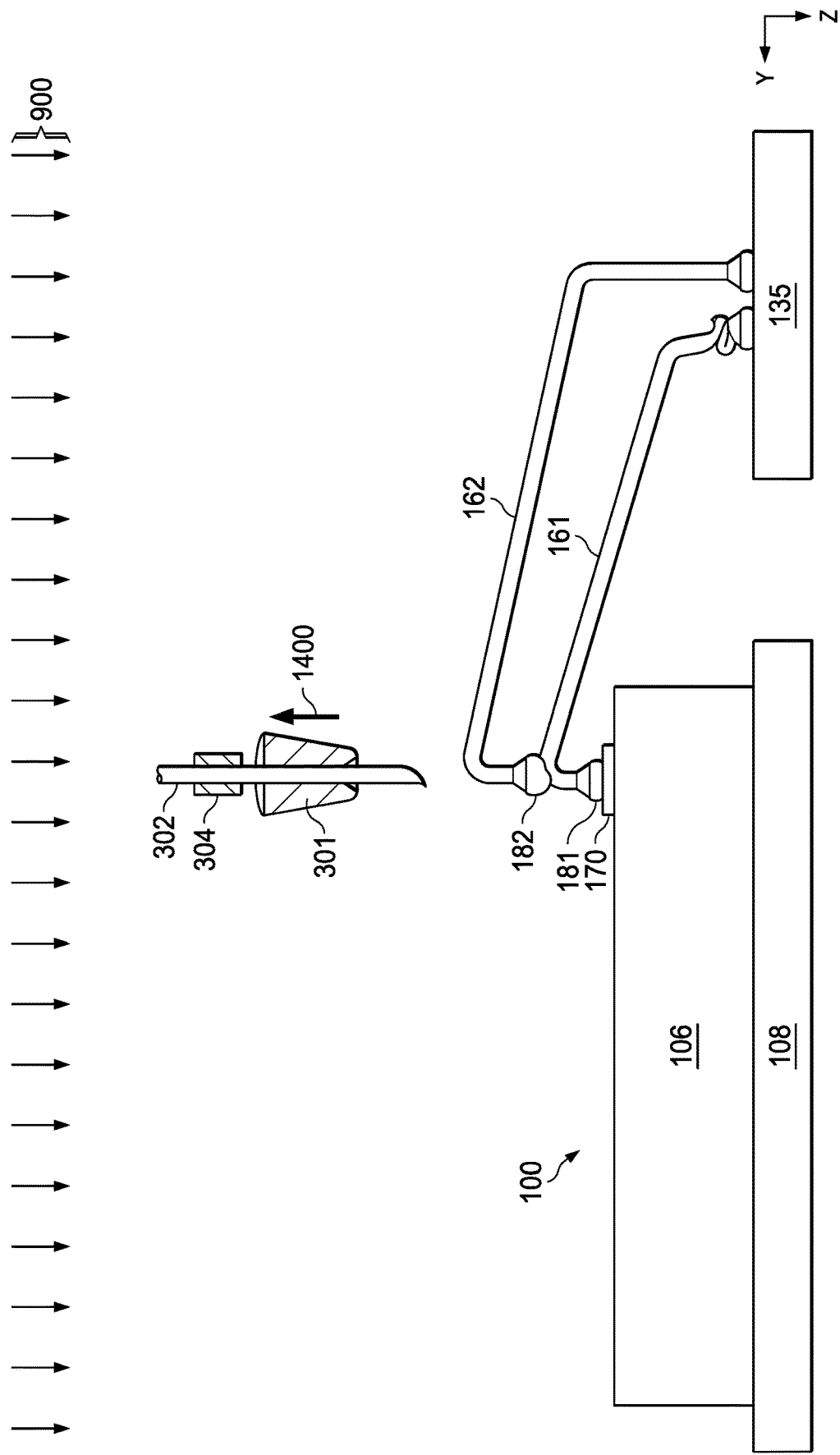

The process 900 continues in FIG. 13 with the position control apparatus moving the nozzle 301 further laterally along the direction 1300 until the center of the nozzle 301 is positioned above the first bond wire 161 above the bond pad 170, and then downward along the direction 1302 to cause the first end of the second bond wire 162 to contact the first bond wire 161 as shown in FIG. 13. In one example, the position control apparatus vibrates the nozzle at high (e.g., ultrasonic) frequencies to bond the first ends of the conductive first and second bond wires 161 and 162 together to form the second bond 182 as a stitch bond, for example, including lateral movement of the nozzle 301 back and forth along the X direction, or in a circular pattern in an X-Y plane, to form the stitch bond connection. In FIG. 14, with the clamp 304 opened, the position control apparatus moves the nozzle 301 upward along the direction 1400. The position control apparatus closes the clamp 304 and raises the nozzle 301 upward along the direction 1400 further away from the conductive terminal 135 to separate or break the wire in the nozzle 301 from the first end of the second bond wire 162 to complete the stitch bond.

Figure 15:
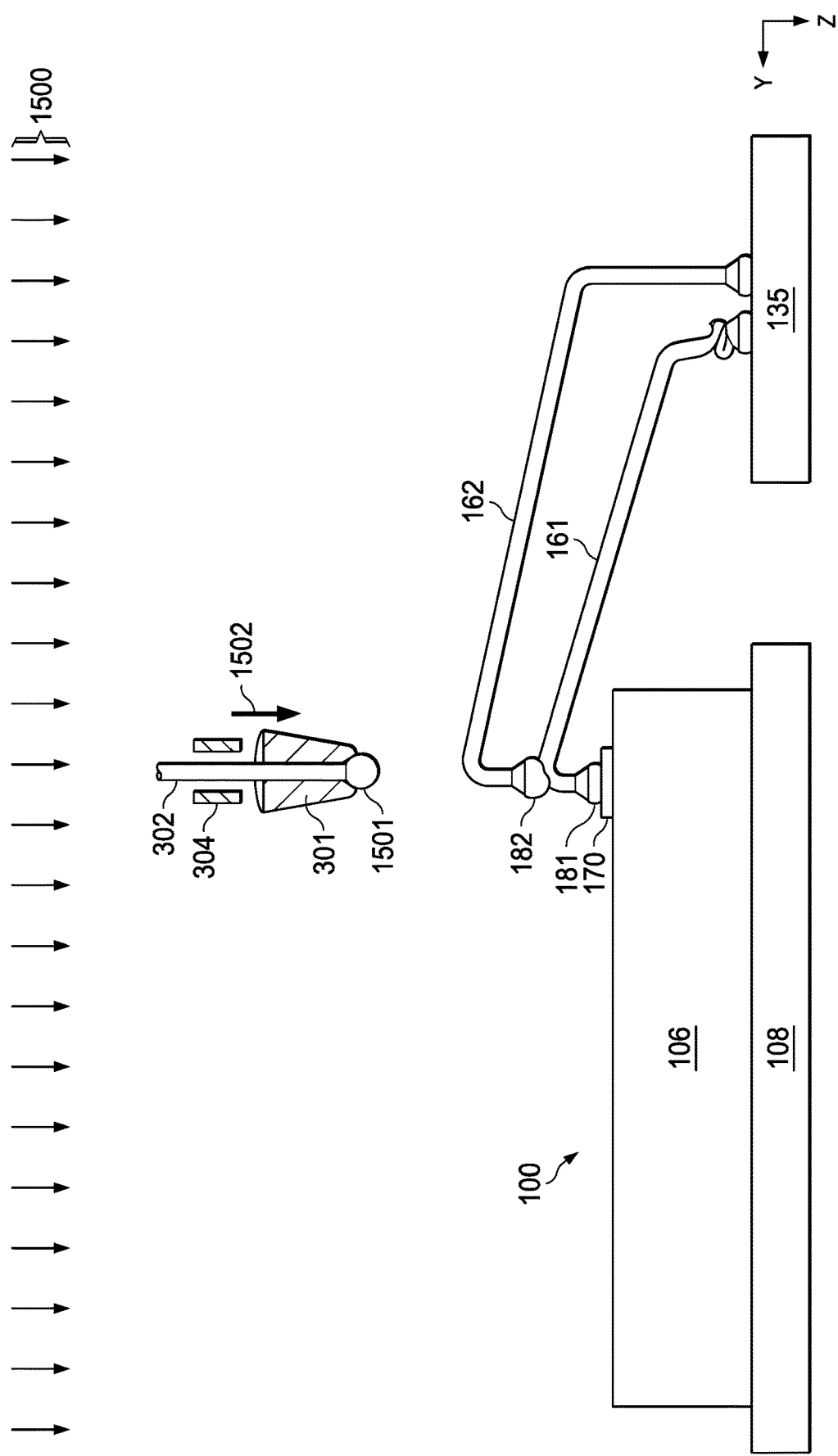
Figure 16:
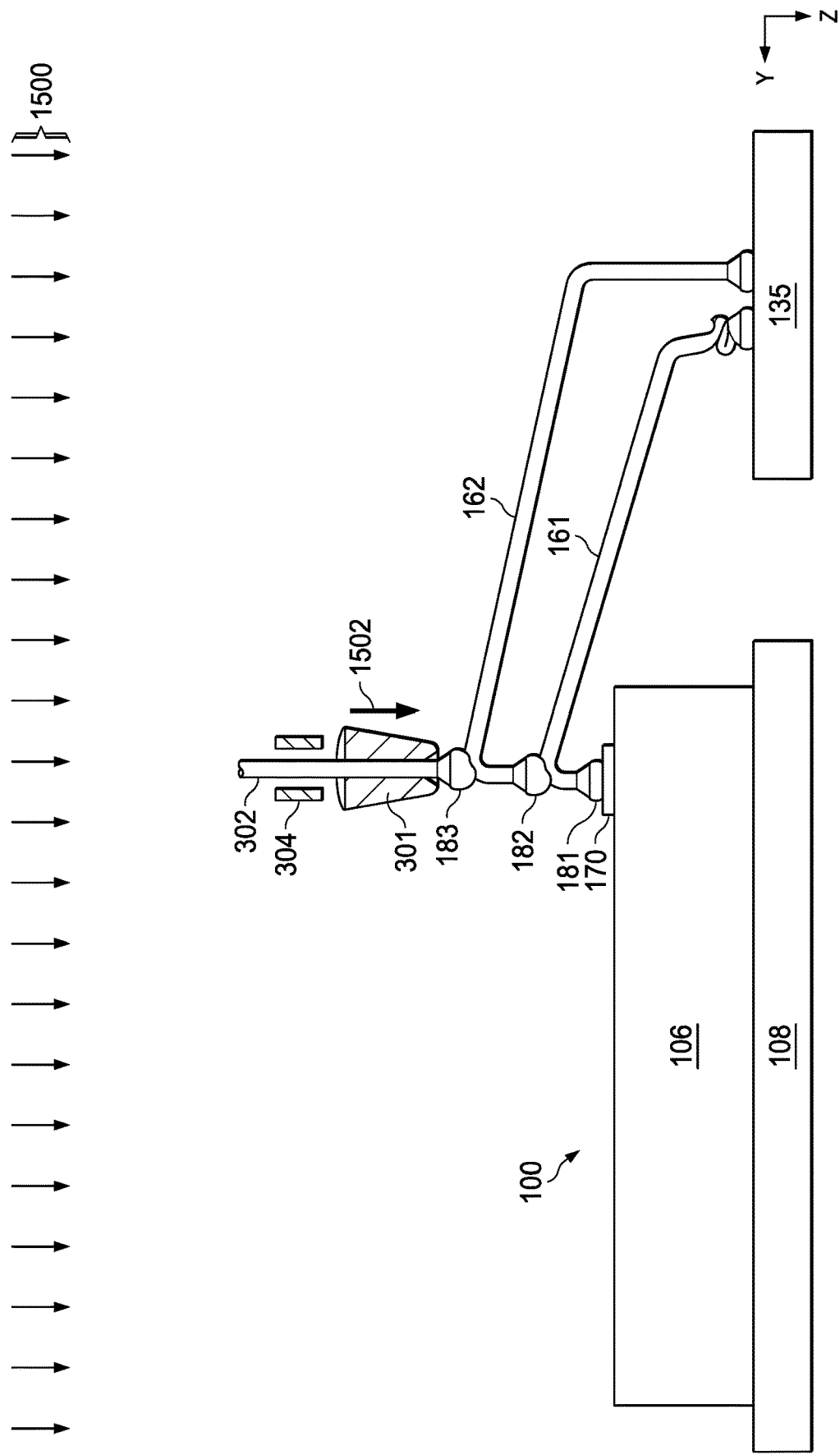

Referring also to FIGS. 15-20, the method 200 in one example further includes forming the third bond wire 163 between the bond pad 170 and the conductive lead 135 by third bond wire formation processing at 219. A third bond wire formation process 1500 starts in FIG. 15 to couple the first end of the third bond wire 163 to the first end of the second bond wire 162 and to couple the second end of the third bond wire 163 to the conductive terminal 135. The position control apparatus moves the nozzle 301 close to the electronic flame source, which is energized to form a flame or arc to melt the end of a conductive wire 302 to form a ball 1501 suspended by the remainder of the wire 302 while the clamp 304 remains closed. The clamp 304 is opened as shown in FIG. 15, and the position control apparatus moves the nozzle 301 downward in FIG. 15 along the direction 1502 to move the ball 1501 toward the second bond wire 162 and the second bond 182 with the clamp 304 open. The downward movement of the nozzle 301 continues with the ball 1501 touching the second bond wire 162 in FIG. 16 and with the ball 1501 progressively collapsing and laterally spreading to form the third bond 183 (e.g., a ball bond) while the clamp 304 remains open. The ball bond joins the first end of the prospective third bond wire 163 to the first end of the second bond wire 162. In one example, the position control apparatus vibrates the nozzle at high (e.g., ultrasonic) frequencies to bond the third bond wire 163 to the first end of the second bond wire 162 as shown in FIG. 16, including lateral movement of the nozzle 301 back and forth along the X direction, or in a circular pattern in an X-Y plane, to form the third bond 183 (e.g., a ball bond).

Figure 17:
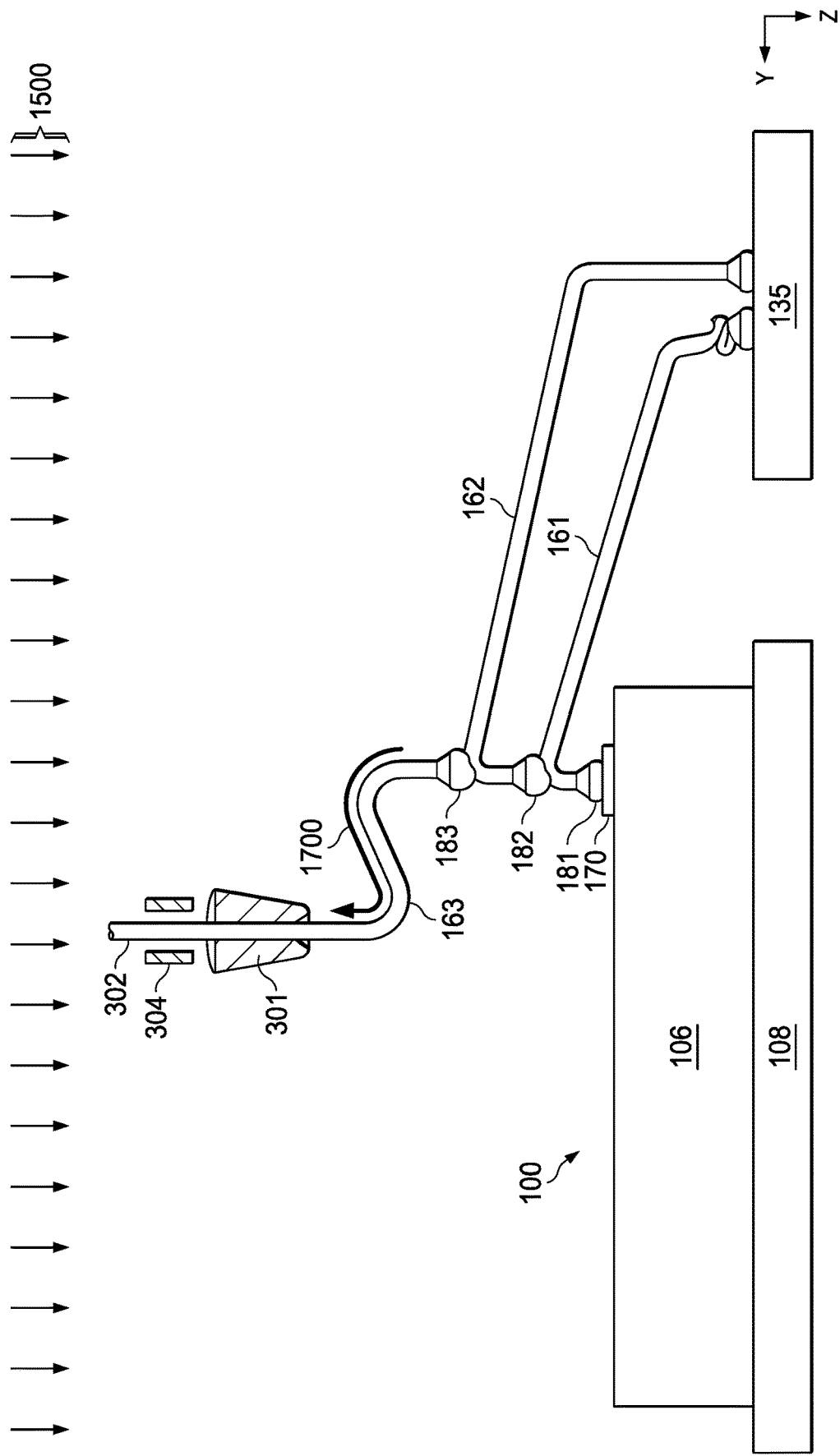
Figure 18:
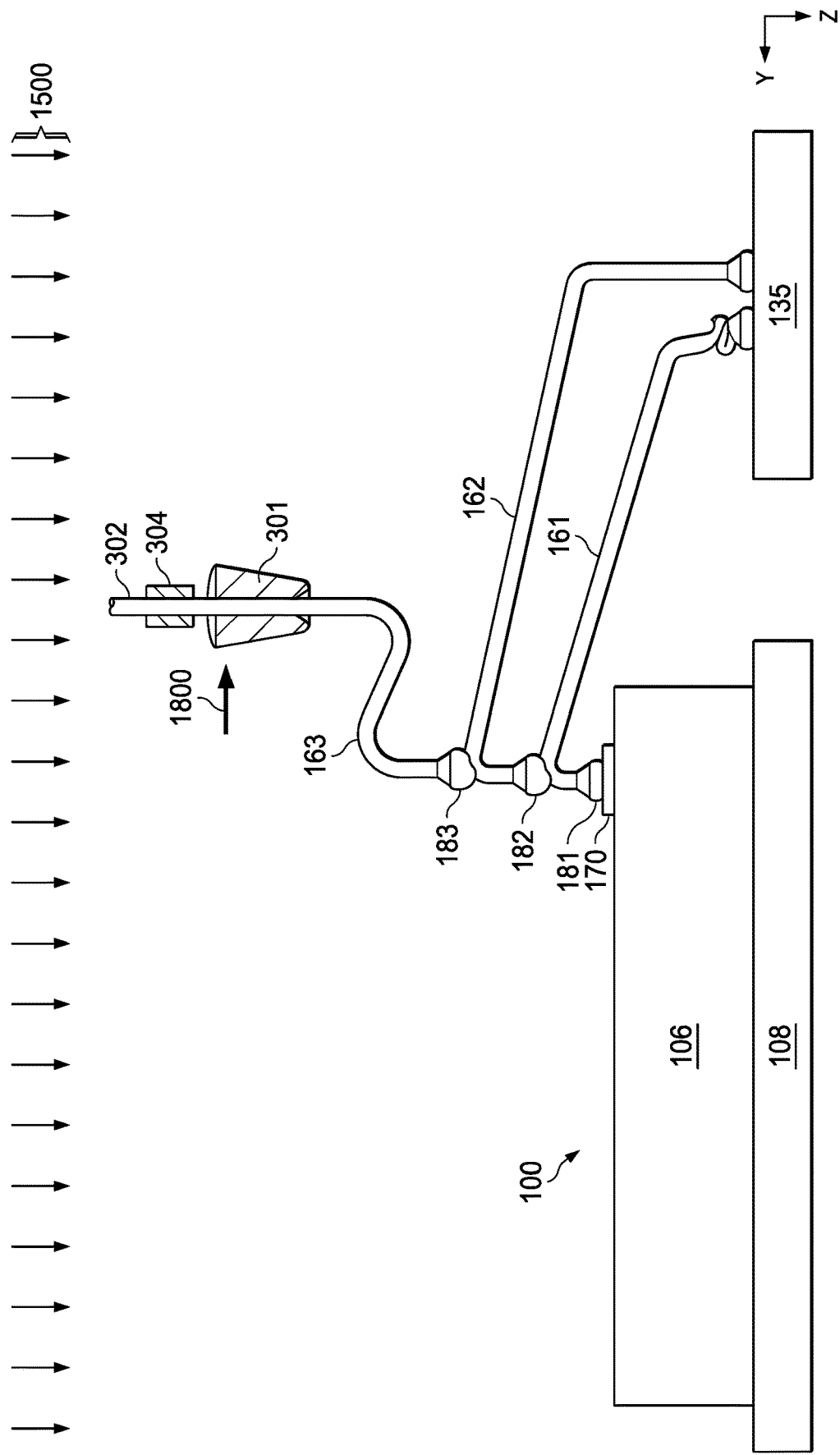

The third bond wire formation process 1500 continues in FIG. 17 where the position control apparatus extends the third bond wire 163 upward and laterally away from the third bond 183 along the direction of arrow 1700 with the clamp 304 open. The clamp 304 is then closed and the position control apparatus moves the nozzle 301 toward the conductive terminal 135 along the direction 1800 in FIG. 18 while the clamp 304 remains closed.

Figure 20:
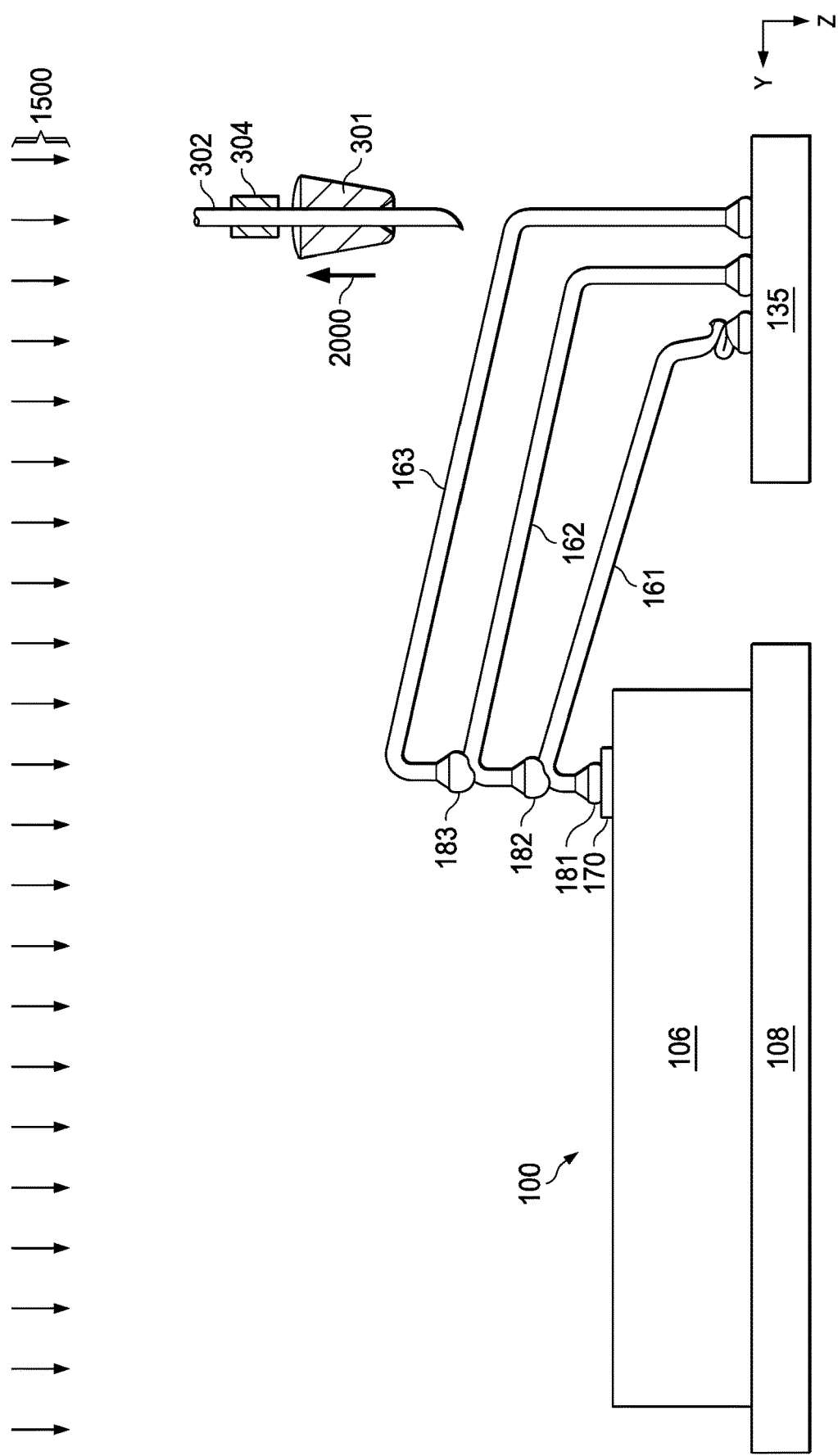

The process 1500 continues in FIG. 19 with the position control apparatus moving the nozzle 301 further laterally along the direction 1900 until the center of the nozzle 301 is positioned above a third portion of the conductive terminal 135 and then downward along the direction 1902 to cause the second end of the third bond wire 163 to contact the conductive terminal 135 as shown in FIG. 19. In one example, the position control apparatus vibrates the nozzle at high (e.g., ultrasonic) frequencies to bond the second end of the conductive third bond wire 163 to the third portion of the top of the conductive terminal 135, for example, including lateral movement of the nozzle 301 back and forth along the X direction, or in a circular pattern in an X-Y plane, to form a stitch bond connection. In FIG. 20, with the clamp 304 opened, the position control apparatus moves the nozzle 301 upward along the direction 2000. As shown in FIG. 20, the position control apparatus closes the clamp 304 and raises the nozzle 301 upward along the direction 2000 further away from the conductive terminal 135 to separate or break the wire in the nozzle 301 from the second end of the third bond wire 163 to complete the stitch bond.

The method 200 continues at 220 with forming the final package structure 120. In one example, the packaging at 220 includes performing a molding process (not shown) that forms the package structure 120 that encloses the semiconductor die 106, the bond wires 161, 162, and 163 and a portion of the conductive terminal 135 in the package structure 120. At 222 in FIG. 2, lead trimming and forming operations are performed along with package separation and other back and processing to provide multiple finished packaged electronic device products, such as the device 100 shown in FIG. 1 above.

The illustrated examples do not require additional bond pads and do not increase the die size, while mitigating or avoiding bond wire failure in integrated semiconductor fuse circuits and increasing the number of wires used in the fuse connection to enable higher current carrying capability. Two or more bond wires (e.g., bond wires 161, 162, 163) are stacked on and electrically coupled (e.g., bonded) to the same bond pad 170 to increase current capability, with or without a stud bump.

Modifications are possible in the described examples, and other implementations are possible, within the scope of the claims.

What is claimed is:

1. An electronic device, comprising:
   a package structure;
   a conductive terminal extending outside the package structure;
   a semiconductor die having a bond pad and a fuse, the bond pad coupled to a portion of the fuse;
   a first bond wire enclosed by the package structure and having first and second ends, the first end of the first bond wire coupled to the bond pad, and the second end of the first bond wire coupled to the conductive terminal via a ball bond; and
   a second bond wire enclosed by the package structure and having first and second ends, the first end of the second bond wire coupled to the first end of the first bond wire, and the second end of the second bond wire coupled to the conductive terminal via a stitch bond.

2. An electronic device, comprising:
   a package structure;
   a conductive terminal extending outside the package structure;
   a semiconductor die having a bond pad and a fuse, the bond pad coupled to a portion of the fuse;
   a first bond wire enclosed by the package structure and having first and second ends, the first end of the first bond wire coupled to the bond pad, and the second end of the first bond wire coupled to the conductive terminal;
   a second bond wire enclosed by the package structure and having first and second ends, the first end of the second bond wire coupled to the first end of the first bond wire, and the second end of the second bond wire coupled to the conductive terminal; and
   a third bond wire enclosed by the package structure and having first and second ends, the first end of the third bond wire coupled to the first end of the second bond wire, and the second end of the third bond wire coupled to the conductive terminal.

3. The electronic device of claim 2, wherein:
   the first end of the second bond wire is bonded to the first end of the first bond wire; and
   the first end of the third bond wire is bonded to the first end of the second bond wire.

4. The electronic device of claim 3, wherein the semiconductor die comprises a protected circuit coupled to a second portion of the fuse.

5. The electronic device of claim 2, wherein the semiconductor die comprises a protected circuit coupled to a second portion of the fuse.

6. The electronic device of claim 2, wherein:
the first end of the first bond wire is coupled to the bond pad by a first bond;
the first end of the second bond wire is bonded to the first end of the first bond wire by a second bond;
the first end of the third bond wire is bonded to the first end of the second bond wire by a third bond; and
one the first, second, and third bonds is a ball bond.

7. The electronic device of claim 6, wherein another one the first, second, and third bonds is a stitch bond.

8. The electronic device of claim 6, wherein the first bond is formed on a stud bump.

9. The electronic device of claim 2, wherein the semiconductor die comprises a protected circuit coupled to a second portion of the fuse.

10. The electronic device of claim 2, wherein:
the first end of the first bond wire is coupled to the bond pad by a first bond;
the first end of the second bond wire is bonded to the first end of the first bond wire by a second bond; and
one the first and second bonds is a ball bond.

11. The electronic device of claim 10, wherein the other one the first and second bonds is a stitch bond.

12. The electronic device of claim 10, wherein the first bond is formed on a stud bump.

13. A fuse circuit, comprising:
a semiconductor die having a bond pad and a fuse, the fuse having first and second portions, the bond pad coupled to the first portion of the fuse, and the second portion of the fuse coupled to a protected circuit;
a first bond wire having first and second ends, the first end of the first bond wire coupled to the bond pad, and the second end of the first bond wire coupled to a conductive terminal via a ball bond; and
a second bond wire having first and second ends, the first end of the second bond wire coupled to the first end of the first bond wire, and the second end of the second bond wire coupled to the conductive terminal via a stitch bond.

14. A fuse circuit, comprising:
a semiconductor die having a bond pad and a fuse, the fuse having first and second portions, the bond pad coupled to the first portion of the fuse, and the second portion of the fuse coupled to a protected circuit;
a first bond wire having first and second ends, the first end of the first bond wire coupled to the bond pad, and the second end of the first bond wire coupled to a conductive terminal; and
a second bond wire having first and second ends, the first end of the second bond wire coupled to the first end of the first bond wire, and the second end of the second bond wire coupled to the conductive terminal; and
a third bond wire having first and second ends, the first end of the third bond wire coupled to the first end of the second bond wire, and the second end of the third bond wire coupled to the conductive terminal.

15. The fuse circuit of claim 14, wherein:
the first end of the first bond wire is coupled to the bond pad by a first bond;
the first end of the second bond wire is bonded to the first end of the first bond wire by a second bond; and
one the first and second bonds is a ball bond.

16. The fuse circuit of claim 14, wherein the first end of the first bond wire coupled to the bond pad by a stud bump.

17. A method for fabricating an electronic device, the method comprising:
attaching a semiconductor die to a die attach pad;
performing a wire bonding process that includes:
coupling a first end of a first bond wire to the bond pad, and coupling a second end of the first bond wire to a conductive terminal, and
coupling a first end of a second bond wire to the first end of the first bond wire, and coupling a second end of the second bond wire to the conductive terminal; and
performing a molding process that encloses the semiconductor die, the first and second bond wires, and a portion of the conductive terminal in a package structure.

18. The method of claim 17, wherein:
the wire bonding process further includes coupling a first end of a third bond wire to the first end of the second bond wire, and coupling a second end of the third bond wire to the conductive terminal; and
the molding process encloses the third bond wire in the package structure.

19. The method of claim 17, wherein the wire bonding process includes:
forming a stud bump on the bond pad; and
coupling the first end of the first bond wire to the stud bump.

20. The method of claim 17, wherein coupling the first end of the second bond wire to the first end of the first bond wire includes ball bonding or stitch bonding the first end of the second bond wire to the first end of the first bond wire.

21. An electronic device, comprising:
a package structure;
a conductive terminal extending outside the package structure;
a semiconductor die having a bond pad and a fuse, the bond pad coupled to a portion of the fuse;
a first bond wire enclosed by the package structure and having first and second ends, the first end of the first bond wire coupled to the bond pad, and the second end of the first bond wire coupled to a stud bump on the conductive terminal; and
a second bond wire enclosed by the package structure and having first and second ends, the first end of the second bond wire coupled to the first end of the first bond wire, and the second end of the second bond wire coupled to another stud bump on the conductive terminal.

* * * * *